United States Patent [19]

Matsubara et al.

[11] Patent Number: 5,933,218
[45] Date of Patent: Aug. 3, 1999

[54] LASER BEAM MACHINING APPARATUS

[75] Inventors: Masato Matsubara; Tsukasa Fukushima; Miki Kurosawa, all of Tokyo, Japan

[73] Assignee: Mitsubishi Denki Kabushiki Kaisha, Tokyo, Japan

[21] Appl. No.: 08/740,956

[22] Filed: Nov. 5, 1996

[30] Foreign Application Priority Data

Apr. 24, 1996 [JP] Japan .................................... 8-102690

[51] Int. Cl.⁶ ............................ G03B 27/54; H01S 3/098
[52] U.S. Cl. ............................................... 355/67; 372/19
[58] Field of Search ................................... 355/53, 67, 40, 355/46, 55, 56, 57, 66; 372/92, 19; 219/121.61, 121.62, 121.74, 121.83

[56] References Cited

U.S. PATENT DOCUMENTS

| | | | |
|---|---|---|---|
| 4,786,947 | 11/1988 | Kosugi et al. | 355/30 |
| 5,105,075 | 4/1992 | Ohta et al. | 355/53 |
| 5,448,333 | 9/1995 | Iwamoto et al. | 355/53 |
| 5,463,202 | 10/1995 | Kurosawa et al. | 219/121.83 |
| 5,486,895 | 1/1996 | Leidig et al. | 355/50 |
| 5,570,384 | 10/1996 | Nishida | 372/19 |
| 5,627,627 | 5/1997 | Suzuki | 355/53 |
| 5,661,546 | 8/1997 | Taniguchi | 355/53 |
| 5,698,120 | 12/1997 | Kurosawa et al. | 219/121.62 |

FOREIGN PATENT DOCUMENTS 64-3664  1/1989  Japan ................................. G03F 7/20

OTHER PUBLICATIONS

"Solid–State Laser Engineering" Springer–Verlag, 1992 pp. 174–180.
"Engineering Optics" Springer–Verlag, 1985, pp. 145–164.
J.W.Hardy, "Active Optics: A New Technology for the Control of Light" Proc. IEEE66, 651–697 Jun. 1978).

*Primary Examiner*—Safet Metjahic
*Assistant Examiner*—Hung Henry Nguyen
*Attorney, Agent, or Firm*—Sughrue, Mion, Zinn, Macpeak & Seas, PLLC

[57] ABSTRACT

A laser beam machining apparatus including an image-transfer optical system having a mask inserted in an optical path between a laser oscillator and a workpiece, and a lens for reducing and forming an image of the mask on a processing surface; a focusing optical system; a drive unit for selecting one of the image-transfer optical system and the focusing optical system; and a numerical controller for controlling the image-transfer optical system, the focusing optical system, and the drive unit, wherein one of the image-transfer optical system and the focusing optical system is selected in correspondence with the diameter and depth of a hole to be processed.

12 Claims, 25 Drawing Sheets

LASER BEAM MACHINING APPARATUS

BACKGROUND OF THE INVENTION

The present invention relates to a laser beam machining apparatus used in processing a printed circuit board or the like.

Conventionally available laser beam machining apparatuses are based on either a method in which processing is effected at a focal position of a laser beam by merely focusing the beam or a method in which processing is effected by inserting a mask into a laser beam transmission path and by reducing an image of the mask and forming it on a processing surface after setting the beam diameter to a desired size.

FIG. 27 is a diagram illustrating a cross section of a multilayered printed circuit board. The multilayered printed circuit board is a printed circuit board in which layers of a printed circuit board are insulated from each other by a resin and are superposed one on top of another. To interconnect wiring portions (copper foils) of one layer and another layer, blind via holes or through holes are formed in the substrate, and the cross sections of the holes are plated, thereby interconnecting the wiring portions between the layers. The diameters of the blind via holes or the through holes are becoming smaller due to the trend toward a higher degree of the packaging density of electronic components. In recent years, hole diameters on the order of several hundred microns have come to be required, and the processing of holes having different diameters have been required for one substrate. With the hole diameters of such a measure, it is difficult to cope with them by the conventional drilling, so that processing by using a laser beam is required. In addition, as the increasing trend toward a greater number of layers in the printed circuit board, the processing of blind via holes having different hole depths is required for one substrate.

Further, due to the higher degree of the density of the multilayered printed circuit board, cut processing has also come to be effected by a laser beam.

To effect the fine hole processing by using a laser beam, it is necessary to reduce the size of the laser beam to the size of the diameter of the hole to be processed. As such methods, the following two methods are known: a method in which the laser beam is focused by a lens (the system based on this method will be hereafter referred to as a focusing optical system) and a method in which a mask is provided in the optical path of the laser beam (laser beam transmission path) and an image of the mask is reduced and formed on a processing surface by means of a lens (the system based on this method will be hereafter referred to as an image-transfer optical system).

Next, a description will be given of the focusing optical system and the image-transfer optical system.

FIG. 28 is a diagram illustrating a conventional focusing optical system. In the focusing optical system, a laser beam is focused by a lens, and processing is effected in the vicinity of the focal position of the laser beam. At that time, a spatial filter such as the one shown in FIG. 29 is sometimes used to eliminate aberration components of the laser beam for the purpose of improving the laser-beam focusing characteristic.

In FIG. 28, reference numeral 1 denotes a laser oscillator; 2, a laser beam; 5, a focusing optical system; 6, an XY table; 7, a workpiece; 8, a reflecting mirror; and 9, a numerical controller (hereafter referred to as the NC device). The focusing optical system 5 is shown in FIG. 29. Numeral 51 denotes a lens; 52, a spatial filter; and 53, a focusing lens. The spatial filter 52 is disposed at a focal position of the lens 51, i.e., at the position where the beam is subjected to Fourier transform. The spatial filter 52 is used to enhance the beam focusing performance by eliminating the aberration components of the beam, and a detailed description is given in, for example, Walter Koechner, "Solid-State Laser Engineering," Springer-Verlag, 1992, pp. 174–180.

Next, a description will be given of the operation.

A laser beam emitted from the laser oscillator 1 is subjected to Fourier transform onto the spatial filter 52 by the lens 51, and the spatial filter 52 transmits only low-frequency components of the spatial frequencies of the laser beam. The beam with its aberration components eliminated by the spatial filter 52 is focused on the surface of the workpiece 7 by the focusing lens 53.

A plurality of processing conditions, i.e., such conditions as a laser output and the like, are stored in advance in a storage device of the NC device 9. Optimum conditions suited to the material, the thickness, and the processing shape of the workpiece 7 are selected, and the oscillator 1, the XY table 6, and the like are controlled on the basis of the selected conditions.

FIG. 30 is a diagram illustrating a conventional image-transfer optical system. A mask is provided in the laser beam transmission path, and an image of a pin hole in the mask is reduced and formed on a processing surface by means of a lens so as to obtain at the processing surface the laser beam having a diameter defined by the mask.

In FIG. 30, reference numeral 1 denotes the laser oscillator; 2, the laser beam; 3, an image-transfer optical system; 6, the XY table; 7, the workpiece; 8, the reflecting mirror; and 9, the NC device. The image-transfer optical system 3 is shown in FIG. 31. Reference numeral 31 denotes a lens; 32, a mask; and 33, a lens. The positional relationship among the mask 32, the lens 33, and the workpiece 7 is in such a positional relationship that the image of the mask is formed on the workpiece 7 at a certain magnification. As for image formation, a detailed description is given in, for example, K. Iizuka, "Engineering Optics," Springer-Verlag, 1985, pp. 145–164.

Next, a description will be given of the operation.

A laser beam emitted from the laser oscillator 1 is made incident upon the image-transfer optical system 3, and is focused by the lens 31 so as to be applied to the mask 32. The reason for focusing is to reduce the energy loss in irradiating the mask having a small diameter. As for the beam which is transmitted through the mask 32, an image of the mask is formed on the surface of the workpiece 7 at a certain reduction ratio by the lens 33.

A plurality of processing conditions, i.e., such conditions as a laser output and the like, are stored in advance in the storage device of the NC device 9. Optimum conditions suited to the material, the thickness, and the processing shape of the workpiece 7 are selected, and the oscillator 1, the XY table 6, and the like are controlled on the basis of the selected conditions.

In the image-transfer optical system, to change the beam diameter on the workpiece 7, a plurality of different masks are prepared in advance, and the mask is replaced by a different one when the beam diameter on the workpiece 7 is to be changed.

Important parameters in the fine-hole processing by using a laser beam are a minimum critical hole diameter R and a maximum critical hole depth DOF. The minimum critical hole diameter R and the maximum critical hole depth DOF can be expressed by the following formulae denoted by the singular reference number (1):

$$R = k_1 \times l \times F$$
$$DOF = k_2 \times l \times (F^2) \quad (1)$$

where
$F = D/f$

D is an effective diameter of the lens, f is a focal length of the lens, l is a wavelength of the laser beam, k1 and k2 are values which are determined by the material of the workpiece 7 and the state of the laser beam, i.e., the amount of aberration and the mode. A comparison of the values of k1 and k2 between the focusing optical system and the image-transfer optical system is shown below. However, it is assumed that the material of the workpiece 7 is the same, and that the state of the beam is also the same.

k1 (focusing optical system)>k1 (image-transfer optical system)

k2 (focusing optical system)>k2 (image-transfer optical system)

That is,

R (focusing optical system)>R (image-transfer optical system)

DOF (focusing optical system)>DOF (image-transfer optical system)

In processing, the image-transfer optical system is capable to processing a hole having a smaller diameter than the focusing optical system, but the depth of the hole which can be processed is shallower in the case of the image-transfer optical system than in the case of the focusing optical system.

FIG. 32 shows processable regions in the focusing optical system and the image-transfer optical system with respect to a certain material subjected to hole processing.

Accordingly, the processing of holes of small diameters is conventionally effected by a laser beam machining apparatus provided with an image-transfer optical system, while the processing of holes of large depths is conventionally effected by a laser beam machining apparatus provided with a focusing optical system. In addition, in the cut processing of multilayered printed circuit boards, since a beam having a large focal depth rather than a beam having a small diameter at the processing surface is required, cut processing is conventionally effected by a laser beam machining apparatus provided with the focusing optical system.

For this reason, in the processing of one multilayered printed circuit board, in order to efficiently and consistently effect the cut processing as well as the processing of through holes and blind via holes having different diameters and depths, it is essential to change over the system between the focusing optical system and the image-transfer optical system in one laser beam machining apparatus.

In the processing of a multilayered printed circuit board using a laser beam, to enhance productivity, an attempt is made to realize high-speed production by moving not only the XY table but also the beam by using a galvanomirror. FIG. 33 shows a laser beam machining apparatus using a galvanomirror.

In FIG. 33, reference numeral 1 denotes the laser oscillator; 2, the laser beam; 19, an image-transfer optical system; 6, the XY table; 7, the workpiece; 8, the reflecting mirror; and 9, the NC device. The image-transfer optical system 19 is shown in FIG. 34. Reference numeral 31 denotes the lens; 32, the mask; 36, an fθ lens; 37, a galvanomirror. The positional relationship among the mask 32, the lens 36, and the workpiece 7 is in such a positional relationship that the image of the mask is formed on the workpiece 7 at a certain magnification when the beam is directed vertically downward from the galvanomirror 37 to the fθ lens 36.

Next, a description will be given of the operation.

A laser beam emitted from the laser oscillator 1 is made incident upon the image-transfer optical system 19. The beam made incident upon the image-transfer optical system 19 is focused by the lens 31 so as to be applied to the mask 32. The reason for focusing is to reduce the energy loss in irradiating the mask having a small diameter. The beam which has been transmitted through the mask 32 is led to the transferring fθ lens 36 by the galvanomirror 37, and an image of the mask reduced at a certain magnification by the fθ lens 36 is formed on the surface of the workpiece 7. The galvanomirror 37 is capable of guiding the beam to an arbitrary position on the fθ lens 36, with the result that the beam can be scanned by the galvanomirror 37 to the extent corresponding to the region of the size of the fθ lens 36 on the workpiece 7.

A plurality of processing conditions, i.e., such conditions as a laser output and the like, are stored in advance in the storage device of the NC device 9. Optimum conditions suited to the material, the thickness, and the processing shape of the workpiece 7 are selected, and the oscillator 1, the XY table 6, the galvanomirror 37, and the like are controlled on the basis of the selected conditions.

The output of a laser oscillator is stable in the vicinity of a rated output, but at a low output the fluctuation width becomes large and the output becomes unstable. Since only several pulses are used in hole processing, variations in the laser output exerts a large effect on variations in the result of processing. Accordingly, the variations in the result of processing become large in a low-output region where the fluctuation width is large.

Since the conventional laser beam machining apparatus is constructed as described above, a number of problems that are listed below have been encountered.

The laser beam machining apparatus having only the focusing optical system is incapable of processing small-diameter holes since its minimum critical processing hole diameter is larger than that in the case of the laser beam machining apparatus having only the image-transfer optical system. Meanwhile, the laser beam machining apparatus having only the image-transfer optical system is incapable of processing deep through holes and blind via holes since the depth of the holes which the apparatus can process is shallower than that in the case of the laser beam machining apparatus having only the focusing optical system. In addition, in cut processing, if the thickness of the printed circuit board becomes large, a beam having a large focal depth at the processing surface is required, so that processing cannot be effected by the laser beam machining apparatus having only the image-transfer optical system.

Further, in the image-transfer optical system, the mask 31 must be changed in order to change the beam diameter on the workpiece 7. Accordingly, productivity declines by the portion of the time need for mask replacement. Additionally, even if a number of kinds of masks with different hole diameters are prepared, it is impossible to cope with the processing of holes with continuously changing diameters.

If a comparison is made between a case where the beam is directed vertically downward from the galvanomirror 37 to the fθ lens 36 and a case where it is directed diagonally downward, the distance between the mask 32 and the fθ lens 36 differs by L1−L0, as shown in FIG. 35. Consequently, in the case where the beam is directed diagonally downward from the galvanomirror 37 to the fθ lens 36, the image of the mask 32 on the workpiece 7 becomes blurred, so that satisfactory processing cannot be effected.

In the low-output region where the fluctuation width is large, variations in the result of processing become large.

SUMMARY OF THE INVENTION

The present invention has been devised to overcome the above-described problems, and it is an object of the present invention to provide a laser beam machining apparatus which is capable of processing and cutting circuit boards having various through holes and blind via holes.

A laser beam machining apparatus in accordance with the present invention comprises: an image-transfer optical system having a mask inserted in an optical path between a laser oscillator and a workpiece, and a lens for reducing and forming an image of the mask on a processing surface; a focusing optical system; selecting means for selecting one of the image-transfer optical system and the focusing optical system; and a numerical controller for controlling the image-transfer optical system, the focusing optical system, and the selecting means, wherein one of the image-transfer optical system and the focusing optical system is selected in correspondence with the diameter and depth of a hole to be processed.

In addition, the laser beam machining apparatus comprises: an image-transfer optical system having a mask inserted in an optical path between a laser oscillator and a workpiece, and a lens for reducing and forming an image of the mask on a processing surface; a focusing optical system; selecting means for selecting one of the image-transfer optical system and the focusing optical system; and a numerical controller for controlling the image-transfer optical system, the focusing optical system, and the selecting means, wherein one of the image-transfer optical system and the focusing optical system is selected in correspondence with details of processing such as hole processing, groove processing, and profile cut processing.

In addition, the laser beam machining apparatus comprises: an image-transfer optical system having a position-changeable mask inserted in an optical path between a laser oscillator and a workpiece, and a curvature-changeable mirror for reducing and forming an image of the mask on a processing surface; and a numerical controller for controlling the image-transfer optical system, wherein a curvature of the curvature-changeable mirror and a position of the mask are controlled in correspondence with a hole diameter.

In addition, the laser beam machining apparatus comprises: an image-transfer optical system having a position-changeable mask inserted in an optical path between a laser oscillator and a workpiece, and a curvature-changeable mirror for reducing and forming an image of the mask on a processing surface; a focusing optical system; selecting means for selecting one of the image-transfer optical system and the focusing optical system; and a numerical controller for controlling the image-transfer optical system, the focusing optical system, and the selecting means, wherein if the image-transfer optical system is selected, a curvature of the curvature-changeable mirror and a position of the mask are controlled in correspondence with a hole diameter.

In addition, the laser beam machining apparatus comprises: an image-transfer optical system having a mask inserted in an optical path between a laser oscillator and a workpiece, a curvature-changeable mirror for reducing and forming an image of the mask on a processing surfaces and changeable means for changing a distance between the processing surface and the curvature-changeable mirror; and a numerical controller for controlling the image-transfer optical system, wherein the curvature of the curvature-changeable mirror and the distance between the processing surface and the curvature-changeable mirror are controlled in correspondence with a hole diameter.

In addition, the laser beam machining apparatus comprises: an image-transfer optical system having a mask inserted in an optical path between a laser oscillator and a workpiece, and a curvature-changeable mirror for reducing and forming an image of the mask on a processing surface; a focusing optical system; selecting means for selecting one of the image-transfer optical system and the focusing optical system; and a numerical controller for controlling the image-transfer optical system, the focusing optical system, and the selecting means, wherein if the image-transfer optical system is selected, the curvature of the curvature-changeable mirror and a distance between the processing surface and the curvature-changeable mirror are controlled in correspondence with a hole diameter.

In addition, the laser beam machining apparatus comprises: an image-transfer optical system having a position-changeable mask inserted in an optical path between a laser oscillator and a workpiece, and a curvature-changeable mirror for reducing and forming an image of the mask on a processing surface; and a numerical controller for controlling the image-transfer optical system, wherein a hole diameter is corrected by controlling a position of the mask in correspondence with an angle of incidence when a laser beam is made incident upon a lens diagonally at an angle.

In addition, the laser beam machining apparatus comprises: an image-transfer optical system having a position-changeable mask inserted in an optical path between a laser oscillator and a workpiece, and a lens for reducing and forming an image of the mask on a processing surface; a focusing optical system; selecting means for selecting one of the image-transfer optical system and the focusing optical system; and a numerical -controller for controlling the image-transfer optical system, the focusing optical system, and the selecting means, wherein if the image-transfer optical system is selected, a hole diameter is corrected by controlling a position of the mask in correspondence with an angle of incidence when a laser beam is made incident upon the lens diagonally at an angle.

In addition, the laser beam machining apparatus comprises: an image-transfer optical system having a mask inserted in an optical path between a laser oscillator and a workpiece, a lens for reducing and forming an image of the mask on a processing surface, and changeable means for changing a distance between the processing surface and the curvature-changeable mirror; and a numerical controller for controlling the image-transfer optical system, wherein energy passing through the mask is adjusted by changing a laser beam diameter on a laser-beam incident side of the mask, so as to adjust energy at the processing surface.

In addition, the laser beam machining apparatus comprises: an image-transfer optical system having a mask inserted in an optical path between a laser oscillator and a workpiece, and a lens for reducing and forming an image of the mask on a processing surface; a focusing optical system; selecting means for selecting one of the image-transfer optical system and the focusing optical system; and a numerical controller for controlling the image-transfer optical system, the focusing optical system, and the selecting means, wherein if the image-transfer optical system is selected, energy passing through the mask is adjusted by changing a laser beam diameter on a laser-beam incident side of the mask, so as to adjust energy at the processing surface.

DETAILED DESCRIPTION OF THE PREFERRED EMBODIMENTS (First Embodiment)

Figure 1:
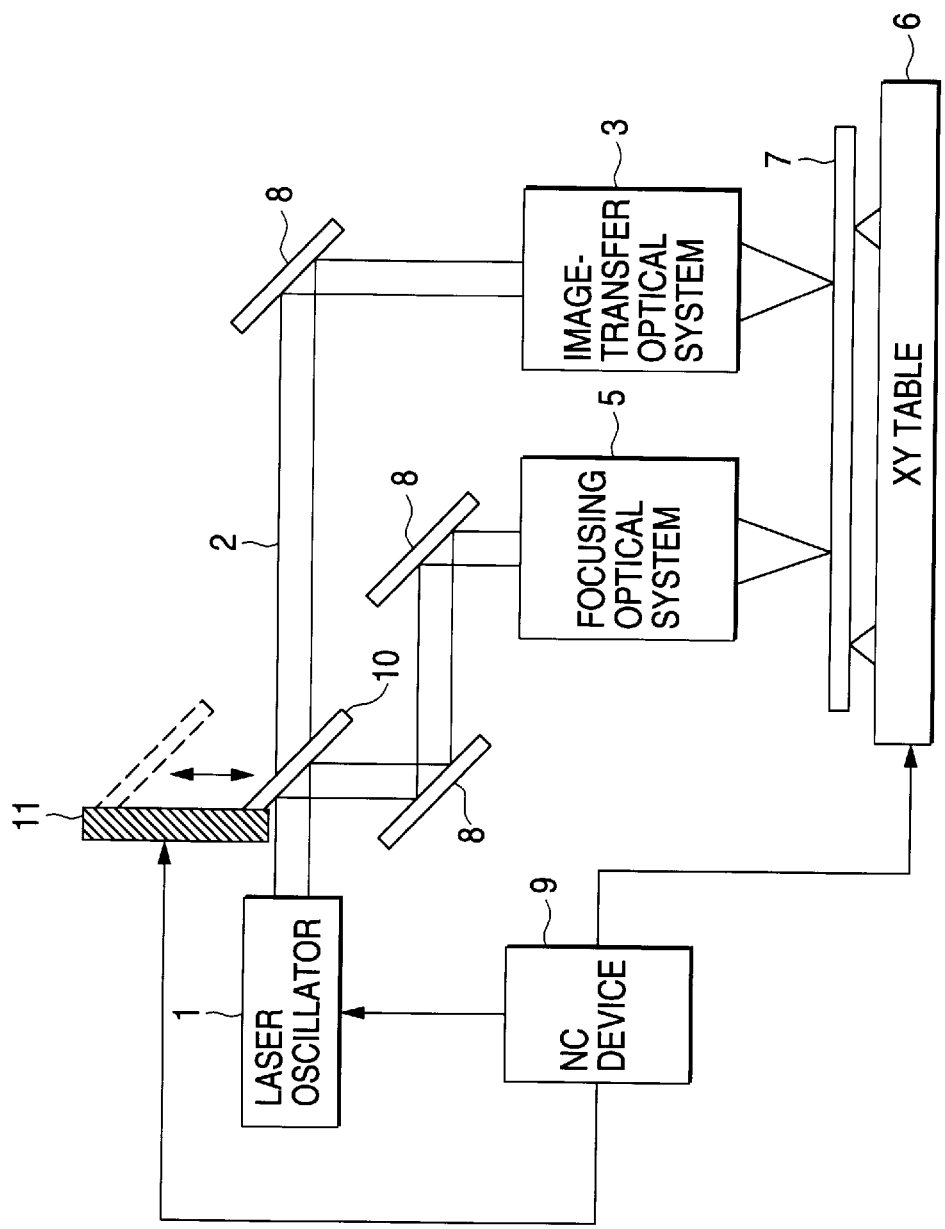
FIG. 1 is a schematic diagram of a laser beam machining apparatus in accordance with first and second embodiments of the present invention.

Hereafter, a description will be given of a first embodiment of the present invention. The configuration of the apparatus is shown in FIG. 1. Reference numeral 1 denotes a laser oscillator; 2, a laser beam; 3, an image-transfer optical system; 5, a focusing optical system; 6, an XY table; 7, a workpiece; 8, a reflecting mirror; 9, an NC device; and 10, a mirror which is provided with a drive unit 11 serving as a selecting means and adapted to shift the laser beam to either the image-transfer optical system 3 or the focusing optical system 5.

Figure 29:
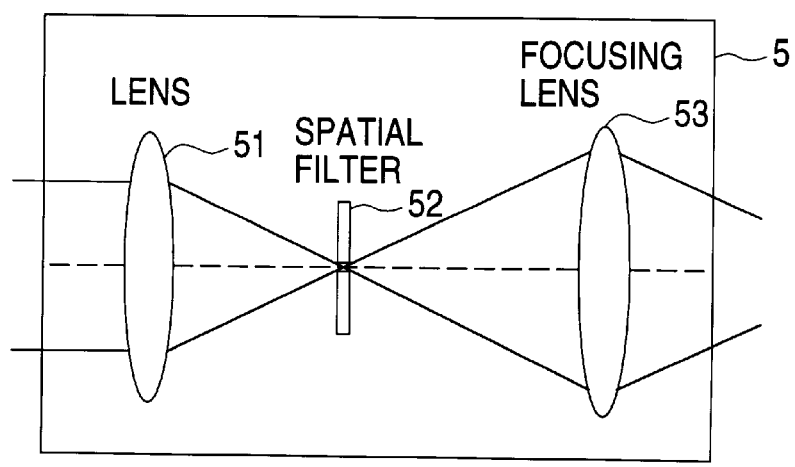
FIG. 29 is a schematic diagram of a conventional focusing optical system.
Figure 30:
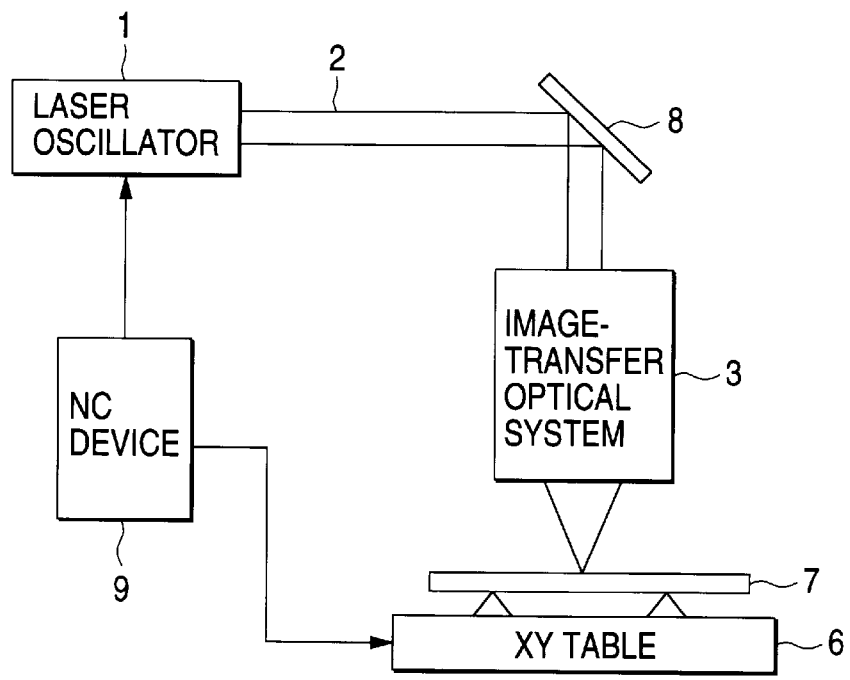
FIG. 30 is a schematic diagram of a conventional laser beam machining apparatus.
Figure 31:
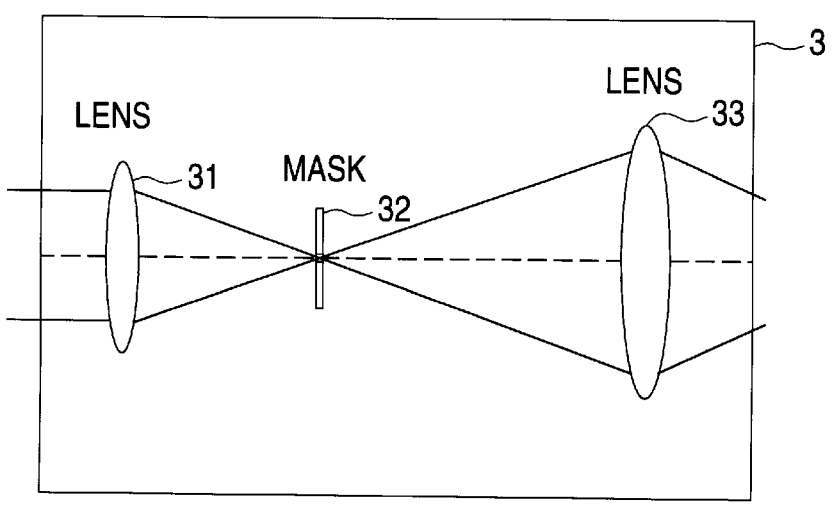
FIG. 31 is a schematic diagram of a conventional image-transfer optical system.

The image-transfer optical system 3 has the same configuration as the one shown in FIG. 31, and the focusing optical system 5 has the same configuration as the one shown in FIG. 29.

Figure 2:
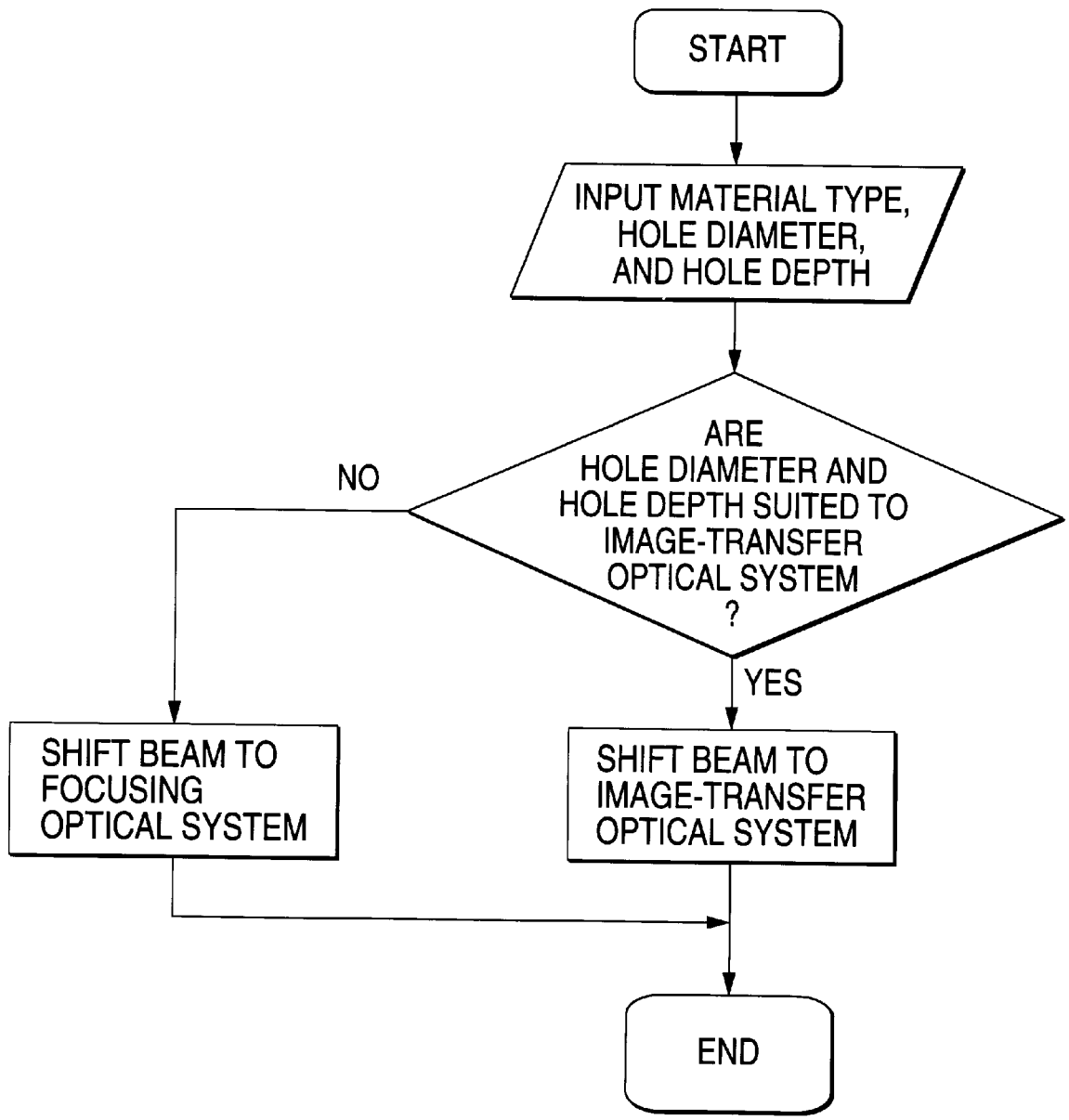
FIG. 2 is a flowchart illustrating a method of control in accordance with the first embodiment of the present invention.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, and the hole depth are selected. Which of the image-transfer optical system or the focusing optical system is suited to processing is stored in advance in the storage device of the NC device 9 depending on the material, the hole diameter, and the hole depth. When an operator inputs the type of material, the hole diameter, and the hole depth to the NC device 9, the mirror 10 is operated by the NC device 9 in such a manner as to automatically shift the beam to either the image-transfer optical system or the focusing optical system. A flowchart in this case is shown in FIG. 2. Alternatively, the operator may manually effect the shift.

Figure 32:
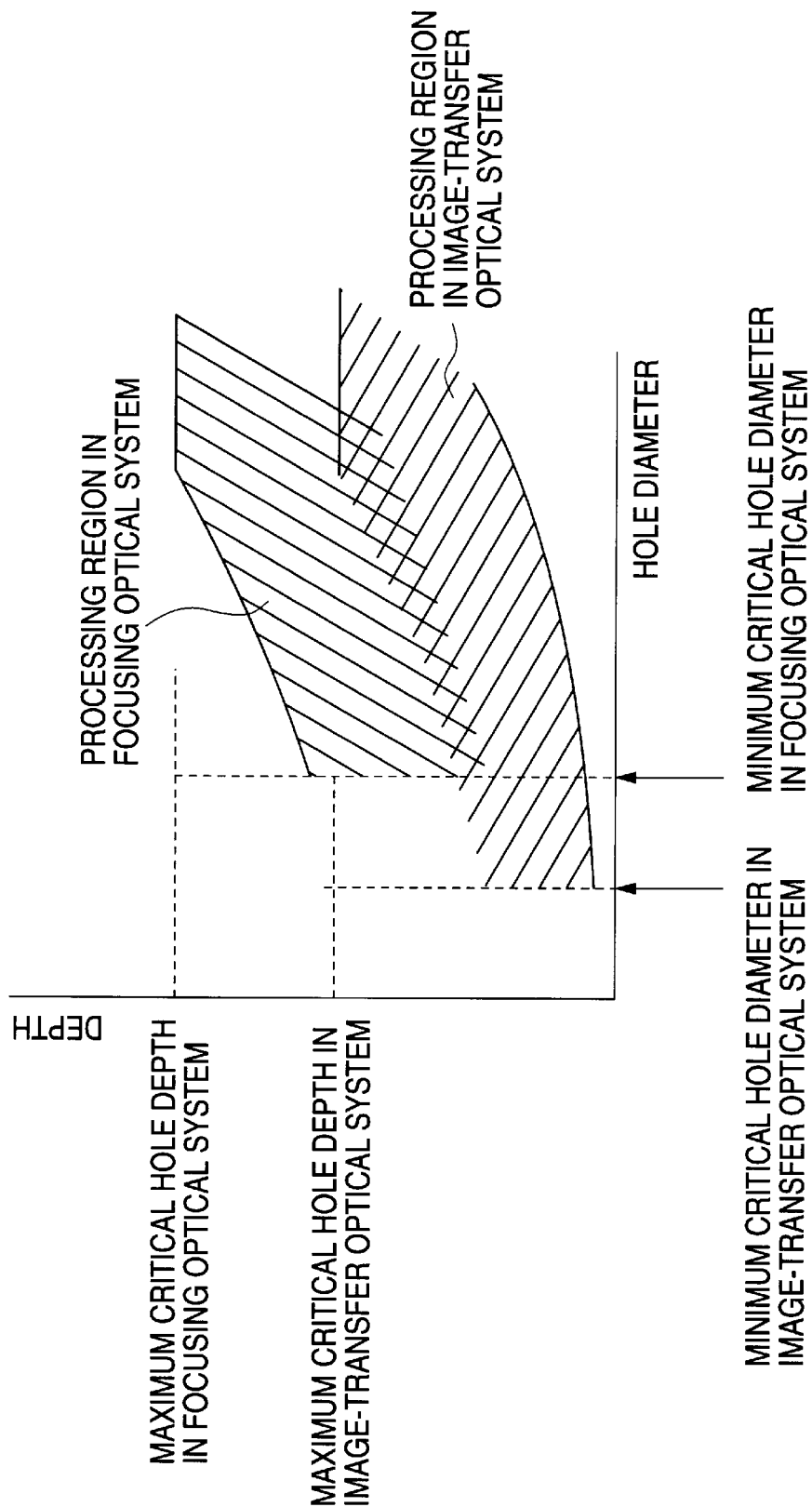
FIG. 32 is a diagram illustrating processable regions of a certain material in the focusing optical system and the image-transfer optical system.
Figure 33:
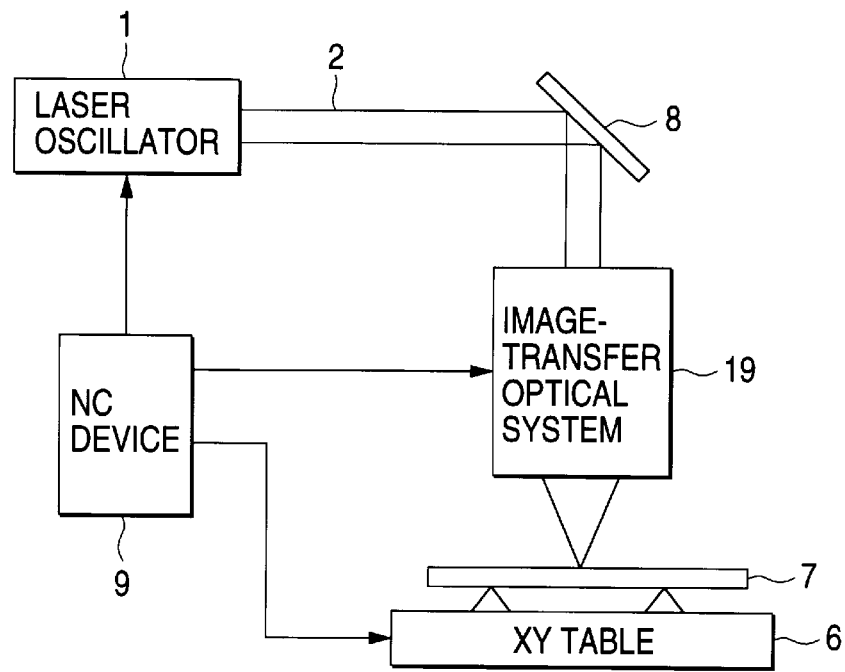
FIG. 33 is a schematic diagram of a conventional laser beam machining apparatus.
Figure 34:
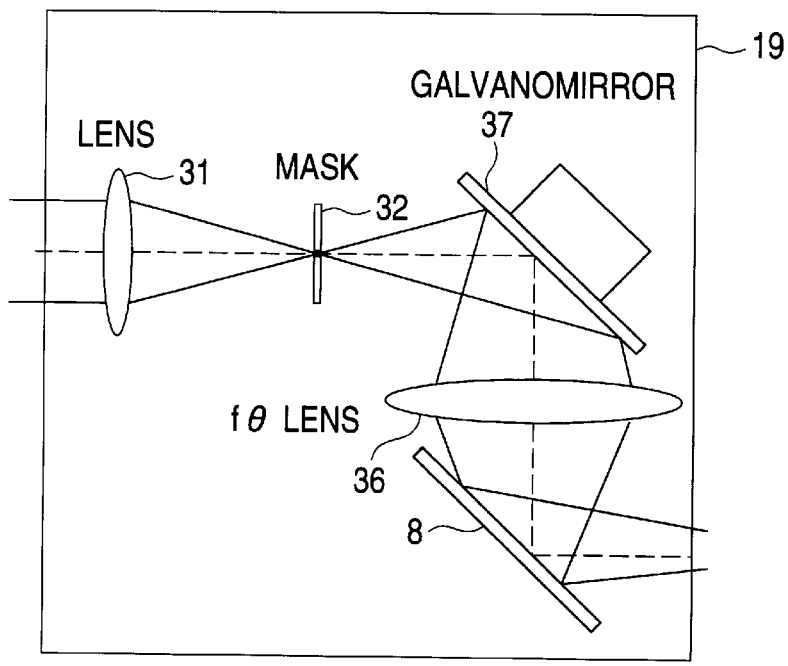
FIG. 34 is a schematic diagram of a conventional image-transfer optical system using a galvanomirror.
Figure 35:
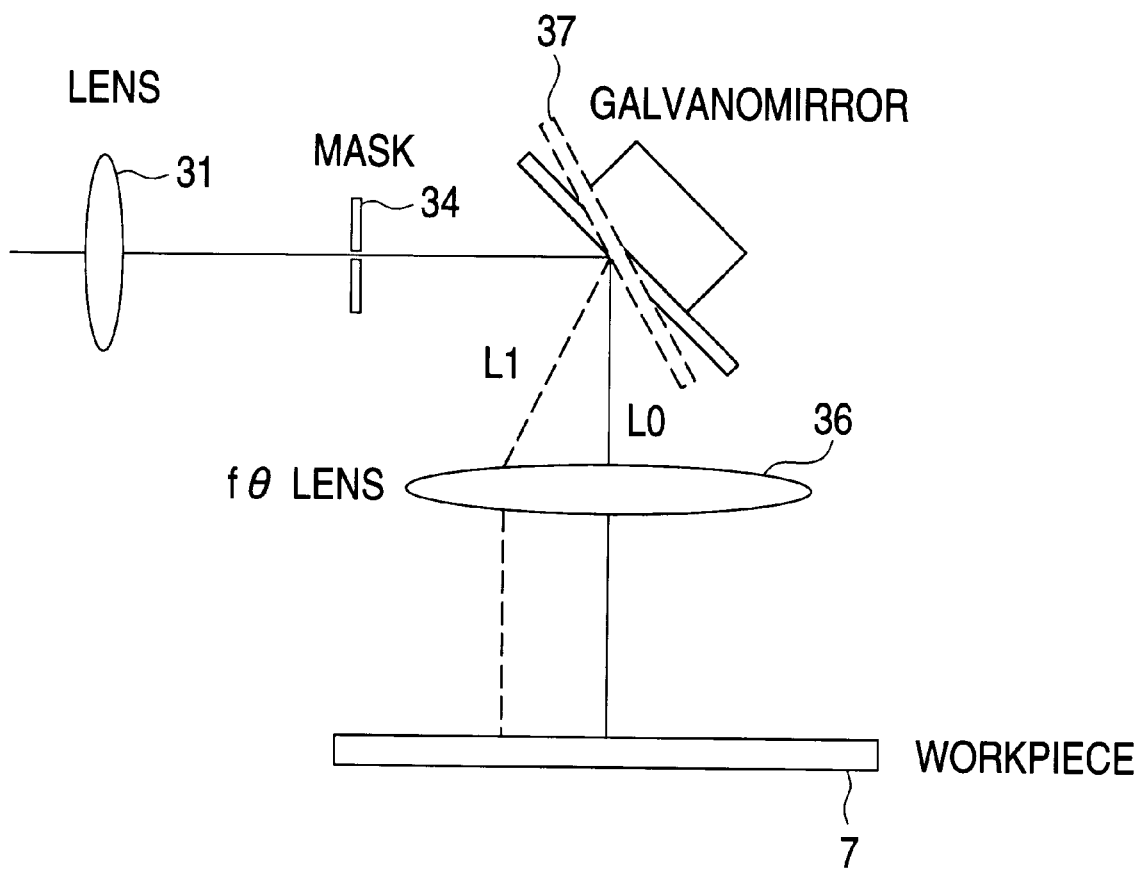
FIG. 35 is a diagram illustrating a deviation of the optical path length in a case where the conventional galvanomirror is used and in a case where the conventional fθ lens is used.

An example of regions of a material used by the image-transfer optical system and the focusing optical system is the same as the one shown in FIG. 32. The regions of use differ depending on the material.

(Second Embodiment)

While, in the first embodiment, the laser beam is shifted to either the image-transfer optical system or the focusing optical system, in this embodiment either the image-transfer optical system or the focusing optical system is arranged to be inserted into or removed from the optical path between the laser oscillator and the workpiece.

Figure 3:
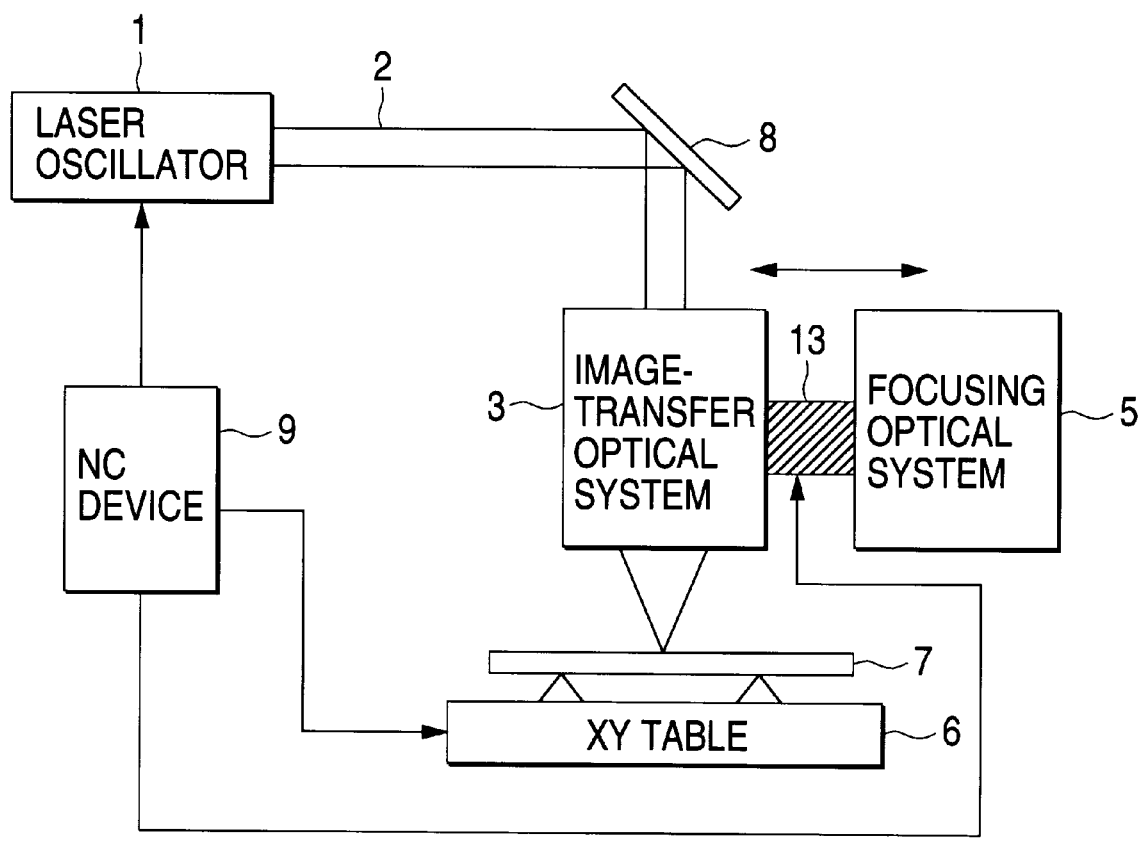
FIG. 3 is a schematic diagram of the laser beam machining apparatus in accordance with the second embodiment of the present invention.

The configuration of the apparatus is shown in FIG. 3. Reference numeral 1 denotes the laser oscillator; 2, the laser beam; 3, the image-transfer optical system; 5, the focusing optical system; 6, the XY table; 7, the workpiece; 8, the reflecting mirror; 9, the NC device; and 13, a drive unit serving as the selecting means for allowing either the image-transfer optical system 3 or the focusing optical system 5 to be inserted into or removed from the optical path between the laser oscillator and the workpiece.

The image-transfer optical system 3 has the same configuration as the one shown in FIG. 31, and the focusing optical system 5 has the same configuration as the one shown in FIG. 29.

Figure 4:
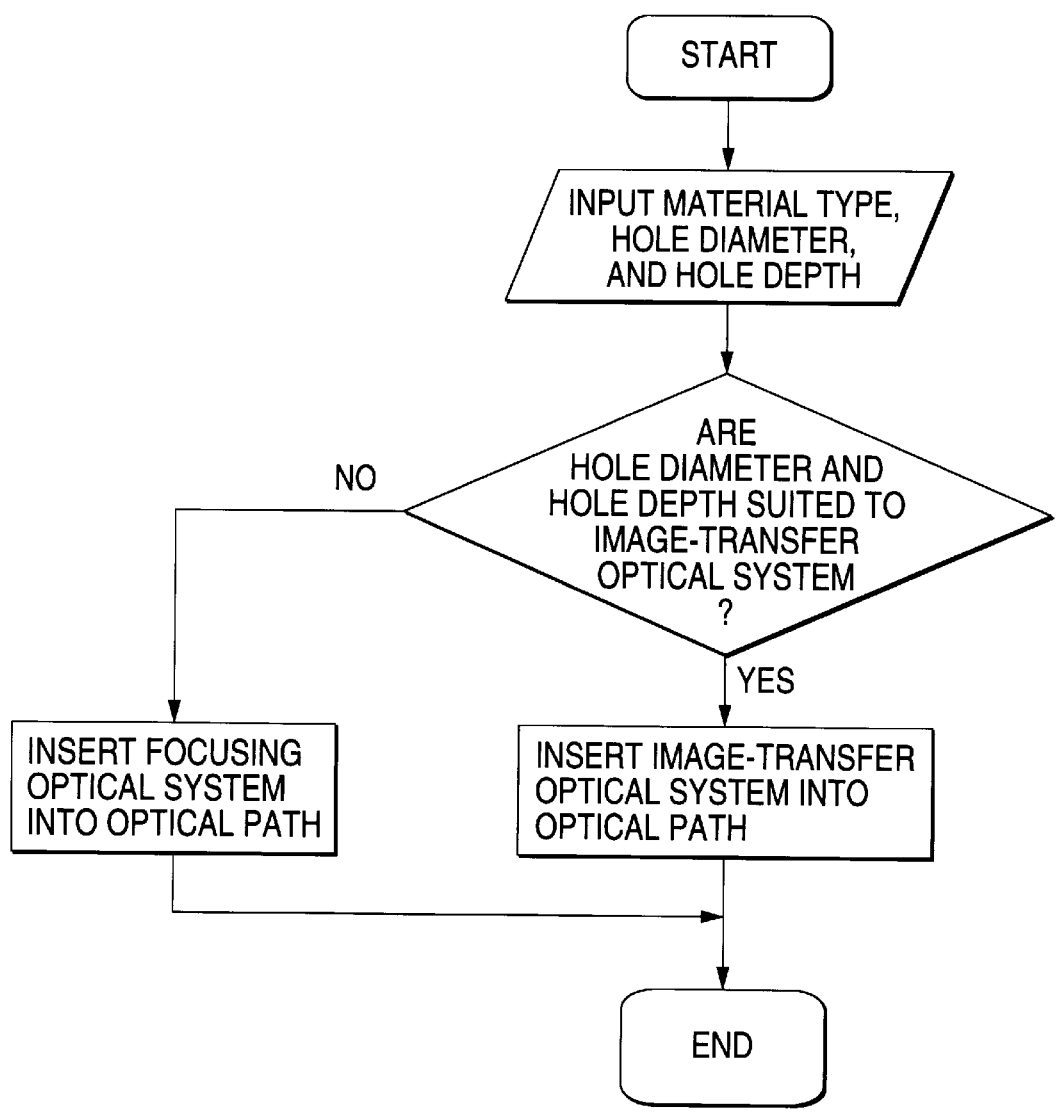
FIG. 4 is a flowchart illustrating a method of control in accordance with the second embodiment of the present invention.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, and the hole depth are selected. Which of the image-transfer optical system or the focusing optical system is suited to processing is stored in advance in the storage device of the NC device 9 depending on the material, the hole diameter, and the hole depth. When the operator inputs the type of material, the hole diameter, and the hole depth to the NC device 9, the drive unit 13 is operated by the NC device 9 in such a manner as to allow either the image-transfer optical system 3 or the focusing optical system 5 to be automatically set between the laser oscillator and the workpiece. A flowchart in this case is shown in FIG. 4. Alternatively, the operator may manually effect the aforementioned setting.

(Third Embodiment)

The configuration of the apparatus is identical to that shown in FIG. 1.

Figure 5:
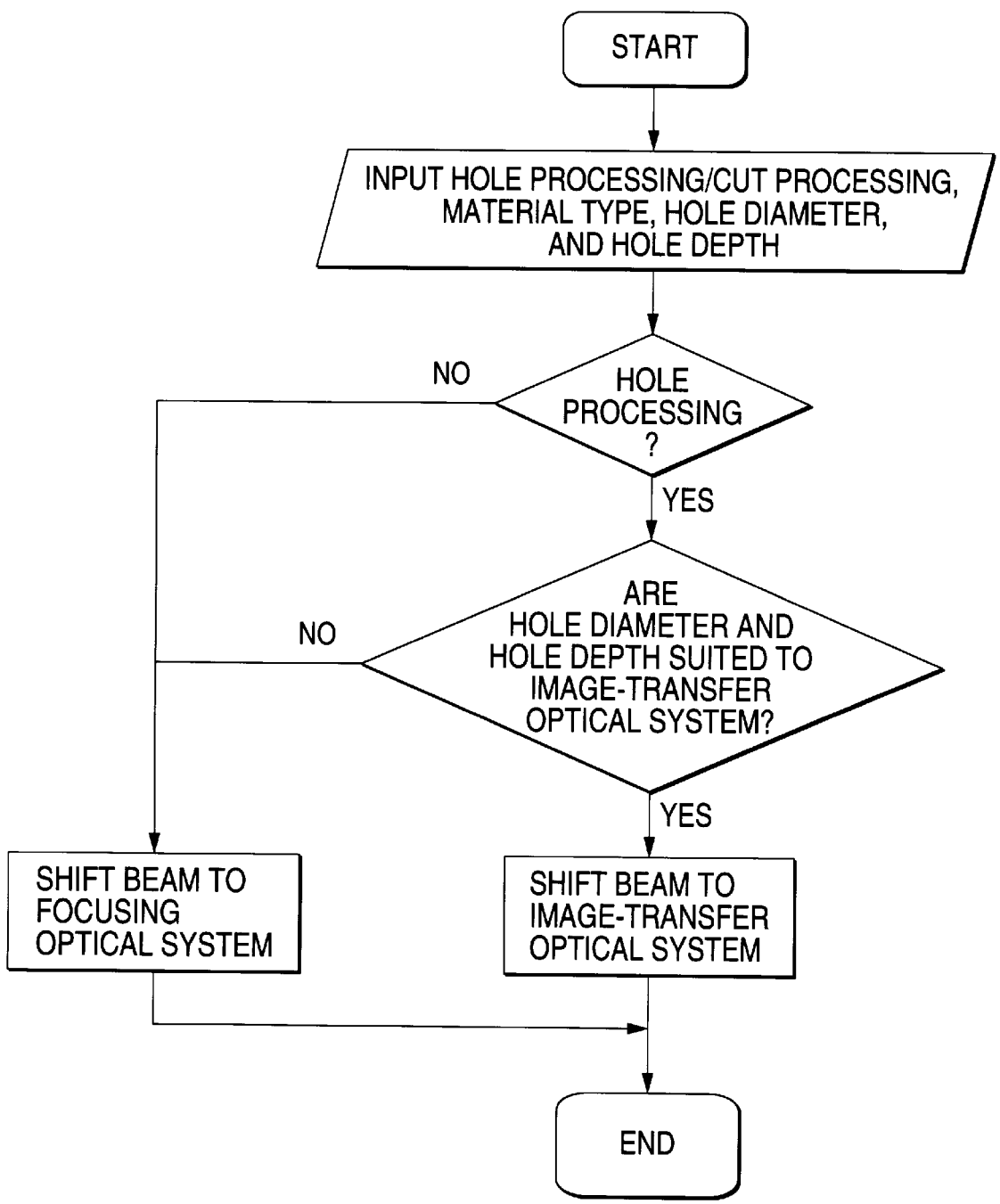
FIG. 5 is a flowchart illustrating a method of control in accordance with a third embodiment of the present invention.

Next, a description will be given of the operation. A plurality of processing conditions, i.e., such conditions as a laser output and the like, are stored in advance in the storage device of the NC device 9. Optimum conditions suited to the material of the workpiece 7, the hole diameter, the hole depth, the type of processing job, i.e., hole processing or cut processing, are selected. Which of the image-transfer optical system or the focusing optical system is suited to processing is stored in advance in the storage device of the NC device 9 depending on the details of processing. When the operator inputs a processing method to the NC device 9, the mirror 10 is operated by the NC device 9 in such a manner as to automatically shift the beam to either the image-transfer optical system or the focusing optical system. A flowchart in this case is shown in FIG. 5. Alternatively, the operator may manually effect the shift.

(Fourth Embodiment)

While, in the third embodiment, the laser beam is shifted to either the image-transfer optical system or the focusing optical system, in this embodiment either the image-transfer optical system or the focusing optical system is arranged to be inserted into or removed from the optical path between the laser oscillator and the workpiece.

The configuration of the apparatus is identical to that shown in FIG. 3.

Figure 6:
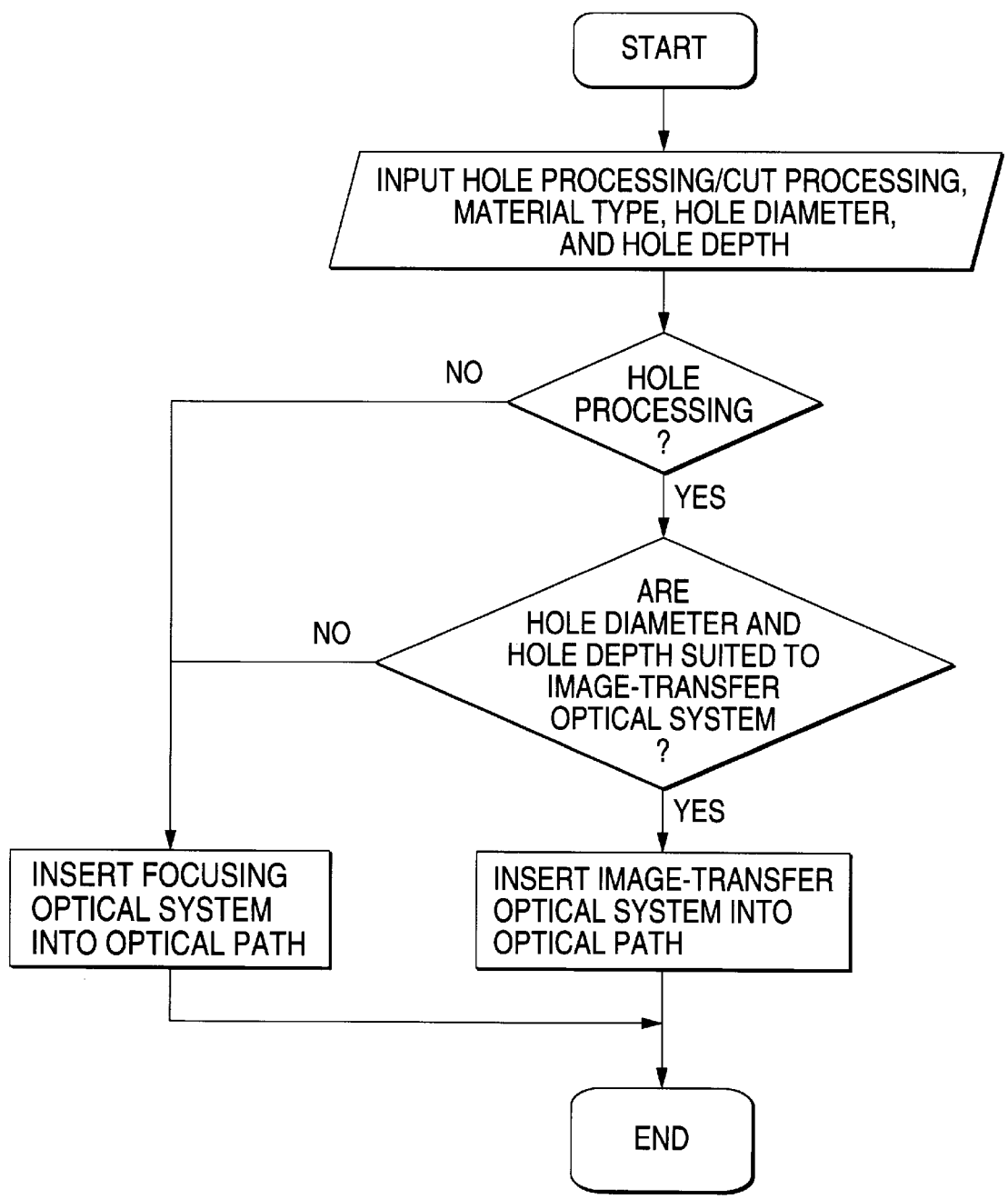
FIG. 6 is a flowchart illustrating a method of control in accordance with a fourth embodiment of the present invention.

Next, a description will be given of the operation. A plurality of processing conditions, i.e., such conditions as a laser output and the like, are stored in advance in the storage device of the NC device 9. Optimum conditions suited to the material of the workpiece 7, the hole diameter, the hole depth, the type of processing job, i.e., hole processing or cut processing, are selected. Which of the image-transfer optical system or the focusing optical system is suited to processing is stored in advance in the storage device of the NC device 9 depending on the details of processing. When the operator inputs a processing method to the NC device 9, the drive unit 13 is operated by the NC device 9 in such a manner as to allow either the image-transfer optical system 3 or the focusing optical system 5 to be automatically set between the laser oscillator and the workpiece. A flowchart in this case is shown in FIG. 6. Alternatively, the operator may manually effect the aforementioned setting.

(Fifth Embodiment)

In a conventional image-transfer optical system, the relationship among a distance d1 between a mask 32 and a transfer lens 33, a distance d2 between the transfer lens 33 and the workpiece 7,. a focal length f of the transfer lens, and a magnification M when the image of the mask 32 is formed can be expressed in simple terms as follows:

$$(1/d1)+(1/d2)=1/f, \ M=(d2)/(d1) \tag{2}$$

Here, if the transfer lens is replaced by a mirror whose curvature is changeable, the focal length can be changed, with the result that the magnification M can be changed. As for curvature-changeable mirrors, a description is given in the Special Issue of the J. Opt. Soc. Am. 63 (March 1977) and J. W. Hardy, "Active Optics: A New technology for the control of light, "Proc. IEEE 66, 651–597 (June 1978).

Figure 7:
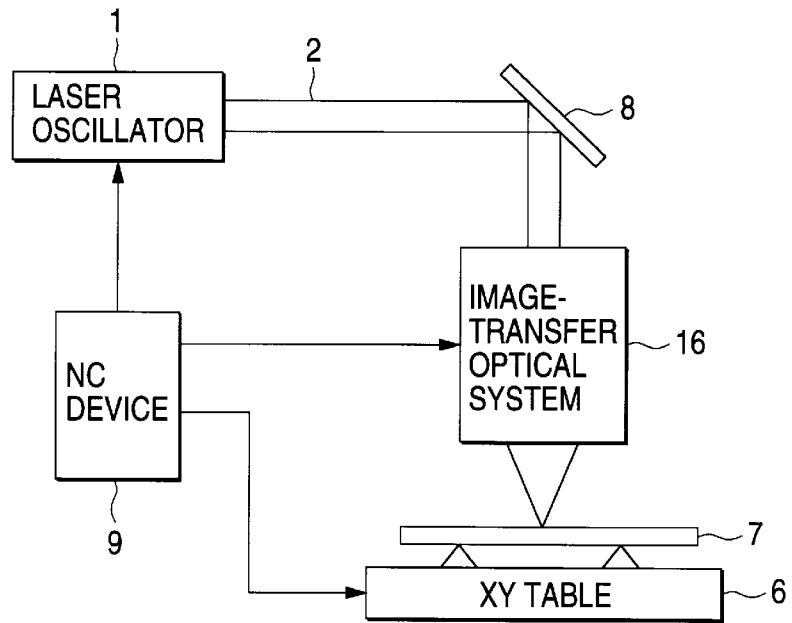
FIG. 7 is a schematic diagram of the laser beam machining apparatus in accordance with a fifth embodiment of the present invention.
Figure 8:
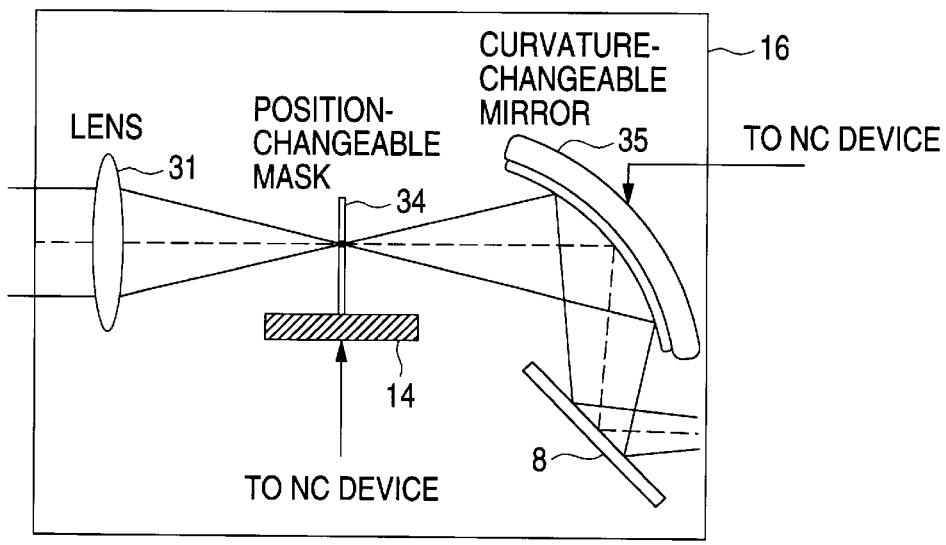
FIG. 8 is a schematic diagram of an image-transfer optical system in accordance with the fifth embodiment and a sixth embodiment of the present invention.

The configuration of the apparatus is shown in FIG. 7. Reference numeral 1 denotes the laser oscillator; 2, the laser beam; 16, the image-transfer optical system; 6, the XY table; 7, the workpiece; 8, the reflecting mirror; and 9, the NC device. The image-transfer optical system 16 is shown in FIG. 8. Reference numeral 31 denotes a lens; 34, a mask whose position can be made changeable by a drive unit 14; and 35, a mirror whose curvature can be made changeable. The positional relationship among the position-changeable mask 34, the curvature-changeable mirror 35, and the workpiece 7 is in such a positional relationship that the image of the mask is formed on the workpiece 7 at a certain magnification.

Next, a description will be given of the operation. From Formula (2), we have $$f=d2/(M+1), M=d2/d1 \quad (3)$$

Figure 9:
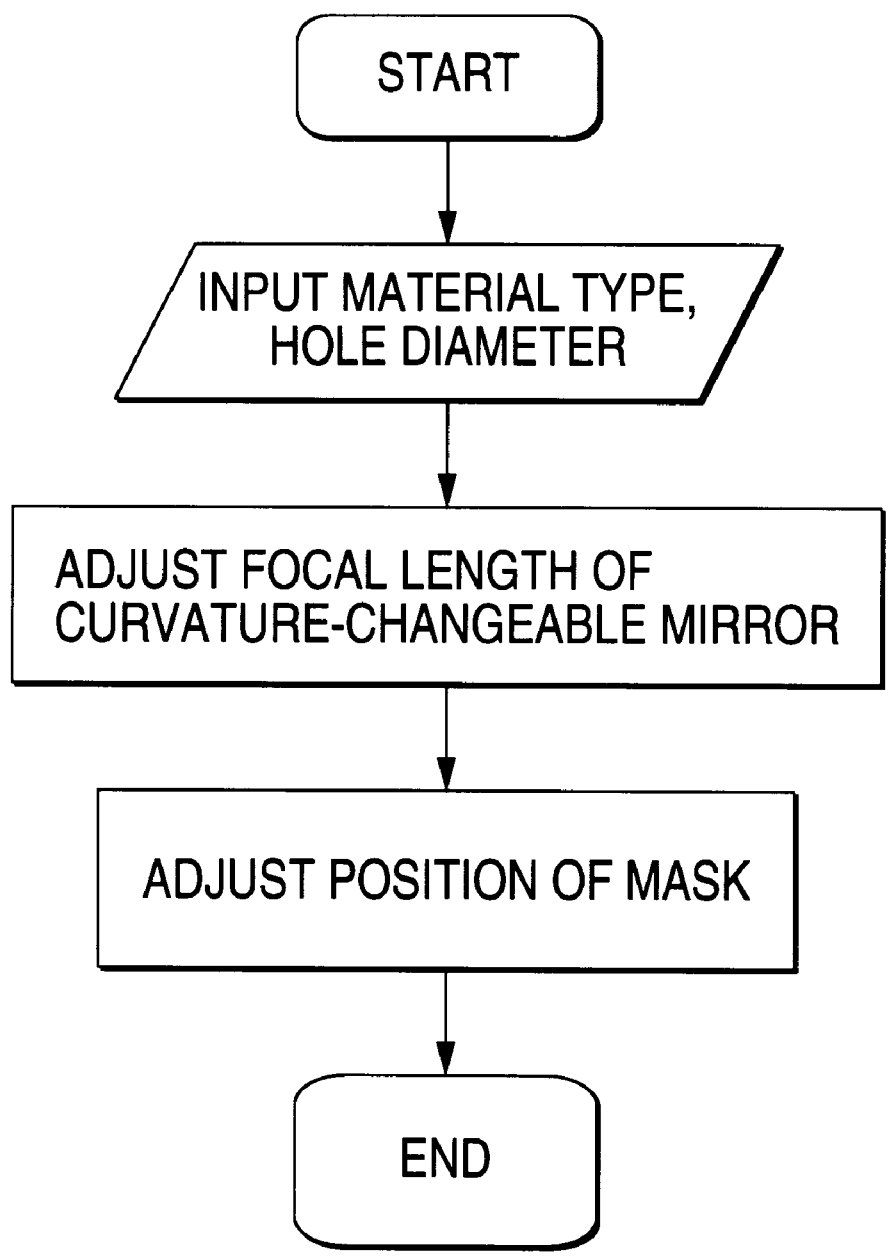
FIG. 9 is a flowchart illustrating a method of control in accordance with the fifth embodiment of the present invention.

In order to reduce the magnification M, i.e., to reduce the beam diameter on the workpiece 7, since the distance d2 (the distance between the curvature-changeable mirror 35 and the workpiece 7) is fixed, the magnification M is reduced by enlarging the distance d1 (the distance between the position-changeable mask 34 and the curvature-changeable mirror 35), and the curvature of the mirror 35 is adjusted so that the focal length f corresponds to the magnification M. Accordingly, when the operator inputs the hole diameter to the NC device, the operation is performed such that the focal length of the curvature-changeable mirror 35 and the position of the mask 34 are set so that the magnification corresponds to the hole diameter. A flowchart in this case is shown in FIG. 9.

(Sixth Embodiment)

Figure 10:
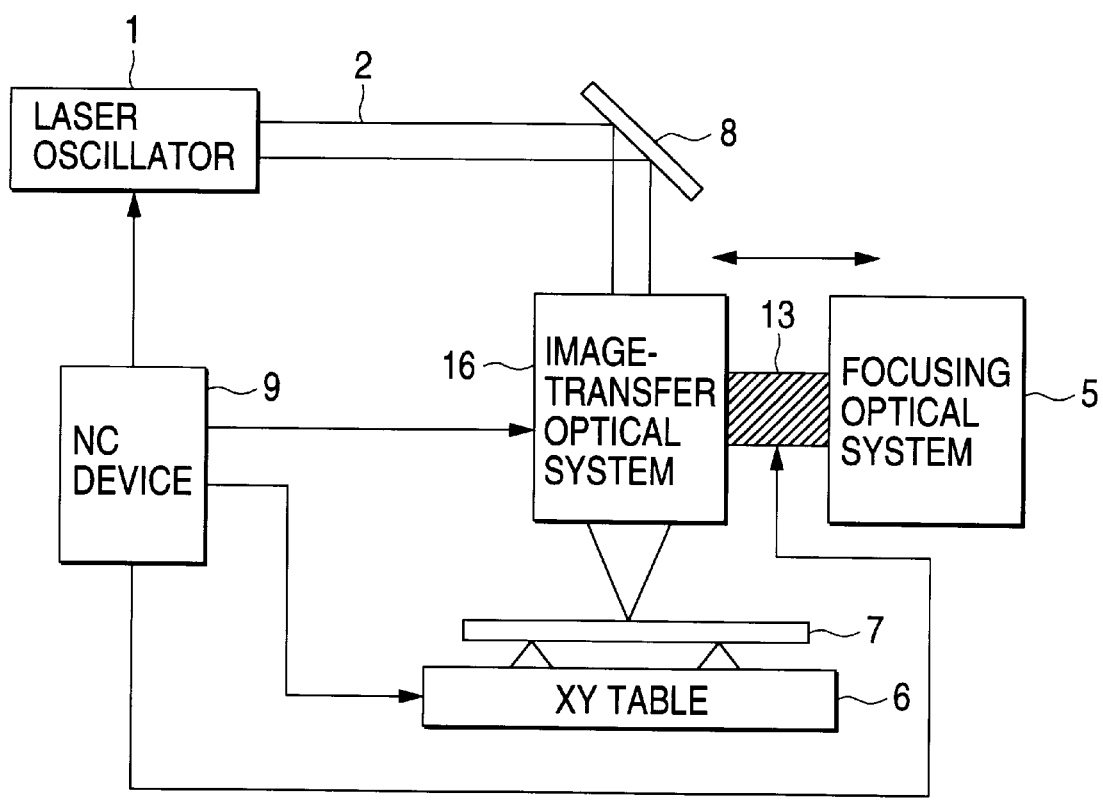
FIG. 10 is a schematic diagram of the laser beam machining apparatus in accordance with the sixth embodiment of the present invention.

The configuration of the apparatus is shown in FIG. 10. Reference numeral 1 denotes the laser oscillator; 2, the laser beam; 16, the image-transfer optical system; 5, the focusing optical system; 6, the XY table; 7, the workpiece; 8, the reflecting mirror; 9, the NC device; and 13, a drive unit for allowing either the image-transfer optical system 16 or the focusing optical system 5 to be inserted into or removed from the optical path between the laser oscillator and the workpiece.

The image-transfer optical system 16 has the same configuration as the one shown in FIG. 8, and the focusing optical system 5 has the same configuration as the one shown in FIG. 29.

Figure 11:
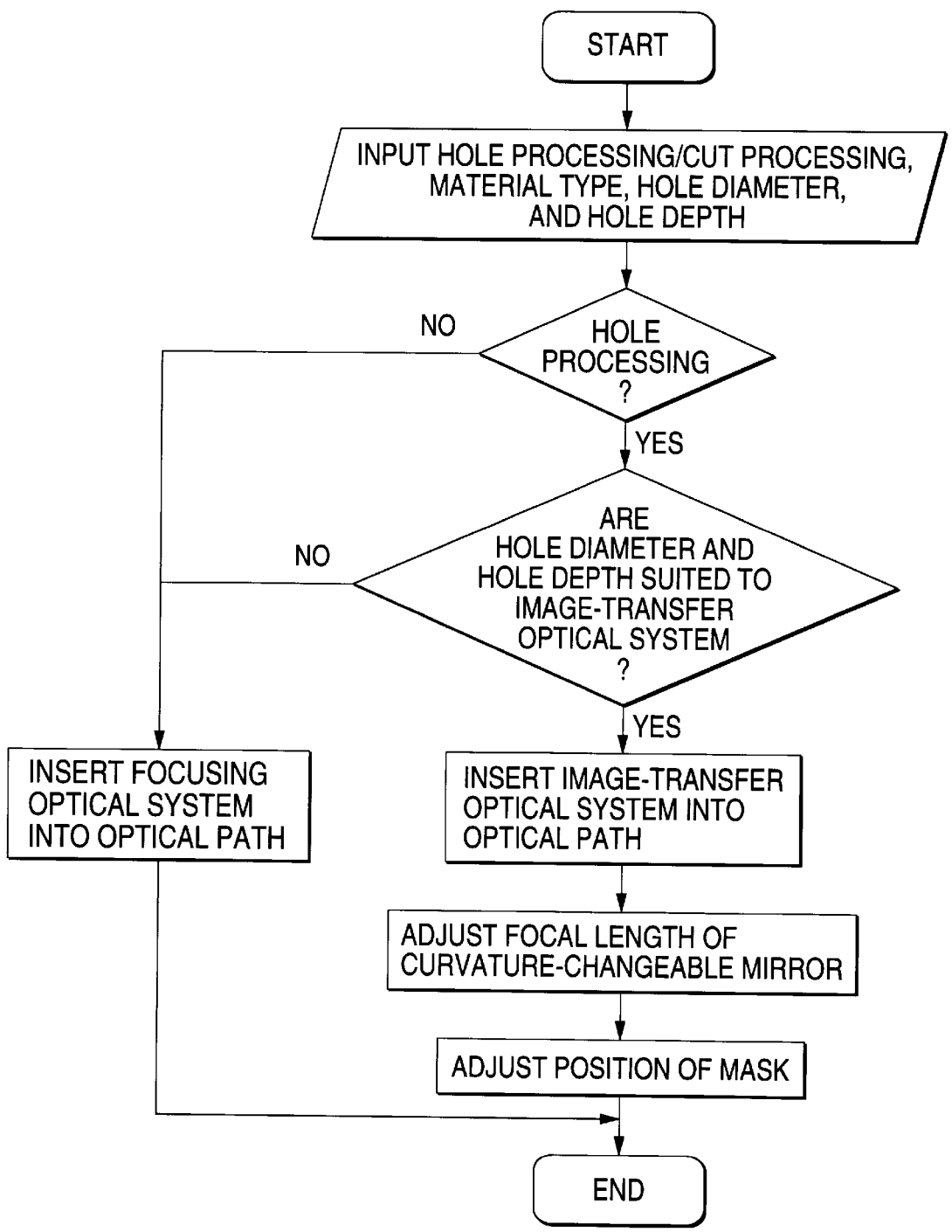
FIG. 11 is a flowchart illustrating a method of control in accordance with the sixth embodiment of the present invention.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, the hole depth, and the type of processing job, i.e., hole processing or cut processing, are selected. Which of the image-transfer optical system or the focusing optical system is suited to processing is stored in advance in the storage device of the NC device 9 depending on the details of processing, the hole diameter, and the hole depth. When the operator inputs a processing method, the hole diameter, and the hole depth to the NC device 9, the drive unit 13 is operated by the NC device 9 in such a manner as to allow either the image-transfer optical system 16 or the focusing optical system 5 to be automatically set between the laser oscillator and the workpiece. When the beam is shifted to the image-transfer optical system 16, the operation is performed such that the focal length of the curvature-changeable mirror 35 and the position of the mask 34 are set so that the magnification corresponds to the hole diameter. A flowchart in this case is shown in FIG. 11.

(Seventh Embodiment)

Figure 12:
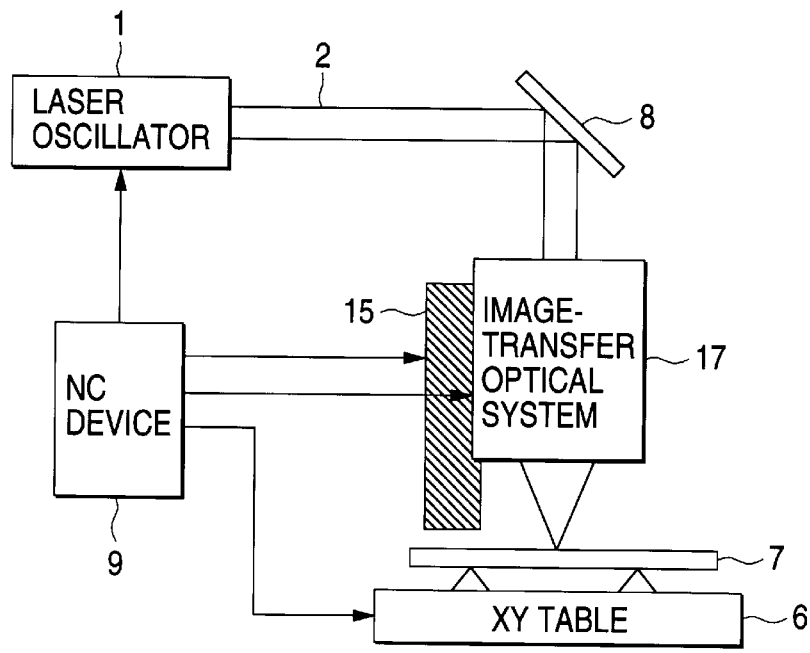
FIG. 12 is a schematic diagram of the laser beam machining apparatus in accordance with a seventh embodiment of the present invention.

The configuration of the apparatus is shown in FIG. 12. Reference numeral 1 denotes the laser oscillator; 2, the laser beam; 17, the image-transfer optical system; 6, the XY table; 7, the workpiece; 8, the reflecting mirror; and 9, the NC device. The position of the image-transfer optical system 17 is changeable by a drive unit 15 so as to render the distance between the image-transfer optical system 17 and the workpiece 7 changeable.

Figure 13:
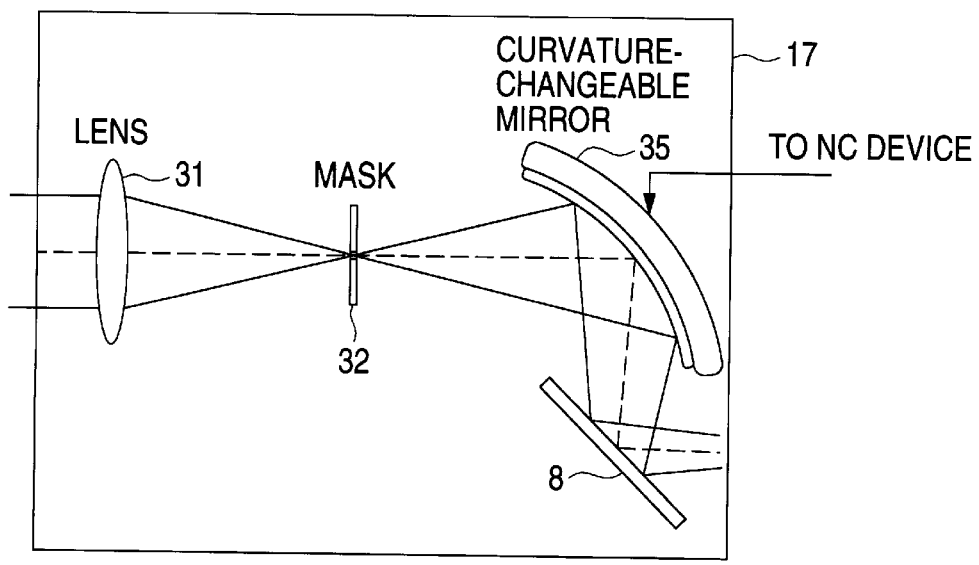
FIG. 13 is a schematic diagram of an image-transfer optical system in accordance with the seventh embodiment and an eighth embodiment of the present invention.

The image-transfer optical system 17 is shown in FIG. 13. Reference numeral 31 denotes the lens; 32, the mask; and 35, the mirror whose curvature can be made changeable. The positional relationship among the mask 32, the curvature-changeable mirror 35, and the workpiece 7 is in such a positional relationship that the image of the mask is formed on the workpiece 7 at a certain magnification.

Next, a description will be given of the operation. From Formula (2), we have $$f=d1 \times M/(1+M), M=d2/d1 \quad (4)$$

In order to reduce the magnification M, i.e., to reduce the beam diameter on the workpiece 7, since the distance d1 (the distance between the mask 32 and the curvature-changeable mirror 35) is fixed, the magnification M is reduced by reducing the distance d2 (the distance between the curvature-changeable mirror 35 and the workpiece 7), and the curvature of the mirror 35 is adjusted so that the focal length f corresponds to the magnification M.

Figure 14:
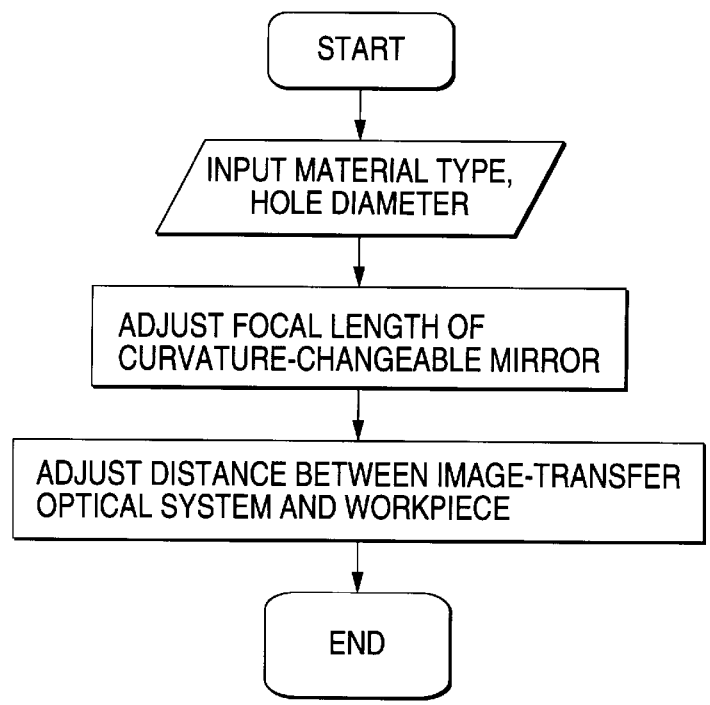
FIG. 14 is a flowchart illustrating a method of control in accordance with the seventh embodiment of the present invention.

Accordingly, when the operator inputs the hole diameter to the NC device, the operation is performed such that the focal length of the curvature-changeable mirror 35 and the distance between the image-transfer optical system 17 and the workpiece 7 are set so that the magnification corresponds to the hole diameter. A flowchart in this case is shown in FIG. 14.

(Eighth Embodiment)

Figure 15:
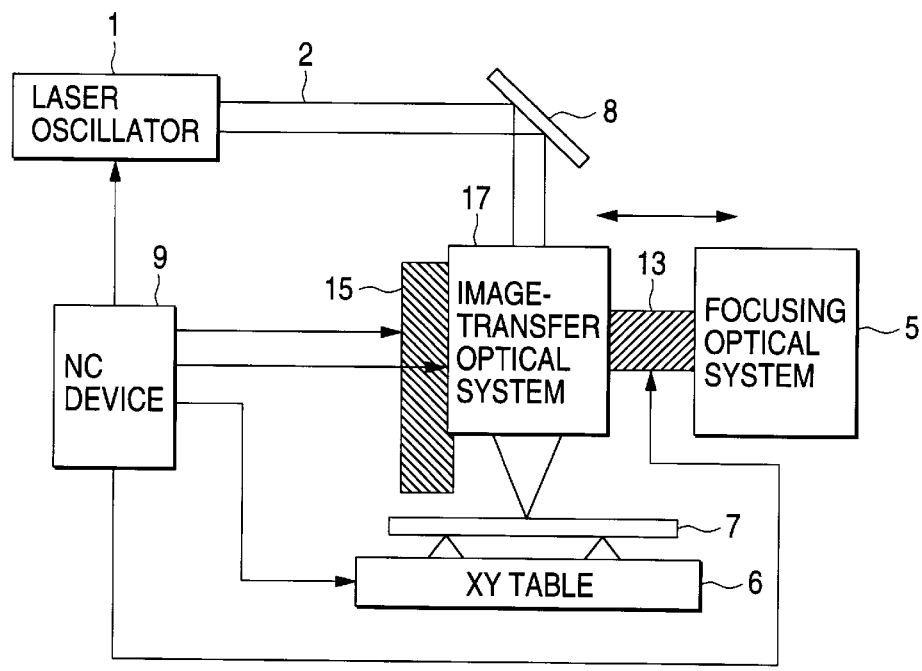
FIG. 15 is a schematic diagram of the laser beam machining apparatus in accordance with the eighth embodiment of the present invention.

The configuration of the apparatus is shown in FIG. 15. Reference numeral 1 denotes the laser oscillator; 2, the laser beam; 17, the image-transfer optical system; 5, the focusing optical system; 6, the XY table; 7, the workpiece; 8, the reflecting mirror; 9, the NC device; and 13, the drive unit for allowing either the image-transfer optical system 17 or the focusing optical system 5 to be inserted into or removed from the optical path between the laser oscillator and the workpiece. The position of the image-transfer optical system 17 is changeable by the drive unit 15 so as to render the distance between the image-transfer optical system 17 and the workpiece 7 changeable.

The image-transfer optical system 17 has the same configuration as the one shown in FIG. 13, and the focusing optical system 5 has the same configuration as the one shown in FIG. 29.

Figure 16:
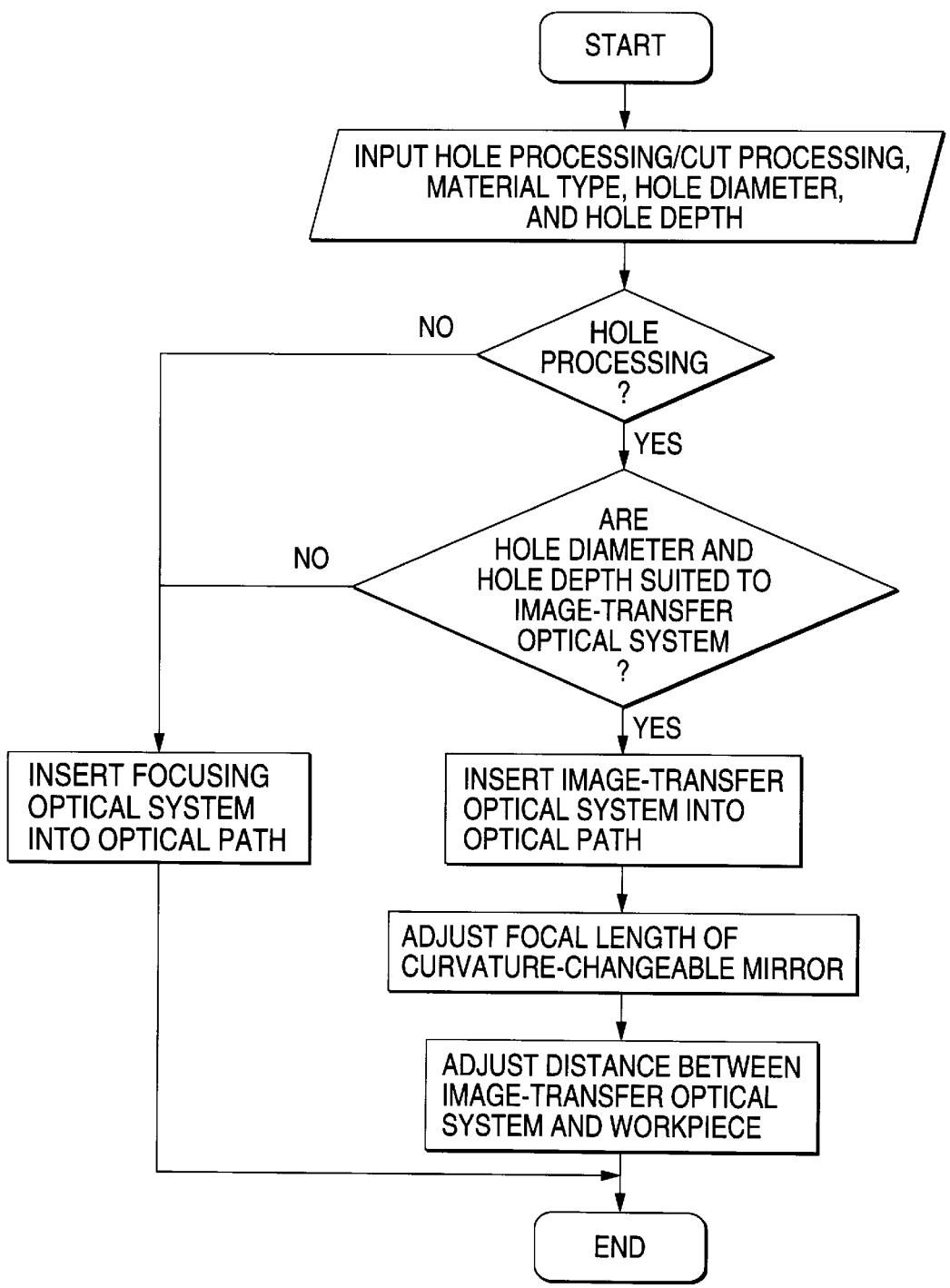
FIG. 16 is a flowchart illustrating a method of control in accordance with the eighth embodiment of the present invention.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, the hole depth, and the type of processing job, i.e., hole processing or cut processing, are selected. Which of the image-transfer optical system or the focusing optical system is suited to processing is stored in advance in the storage device of the NC device 9 depending on the details of processing, the hole diameter, and the hole depth. When the operator inputs a processing method, the hole diameter, and the hole depth to the NC device 9, the drive unit 13 is operated by the NC device 9 in such a manner as to allow either the image-transfer optical system 17 or the focusing optical system 5 to be automatically set between the laser oscillator and the workpiece. When the image-transfer optical system 17 is set in position, the operation is performed such that the focal length of the curvature-changeable mirror 35 and the distance between the image-transfer optical system 17 and the workpiece 7 are set so that the magnification corresponds to the hole diameter. A flowchart in this case is shown in FIG. 16.

(Ninth Embodiment)

Figure 17:
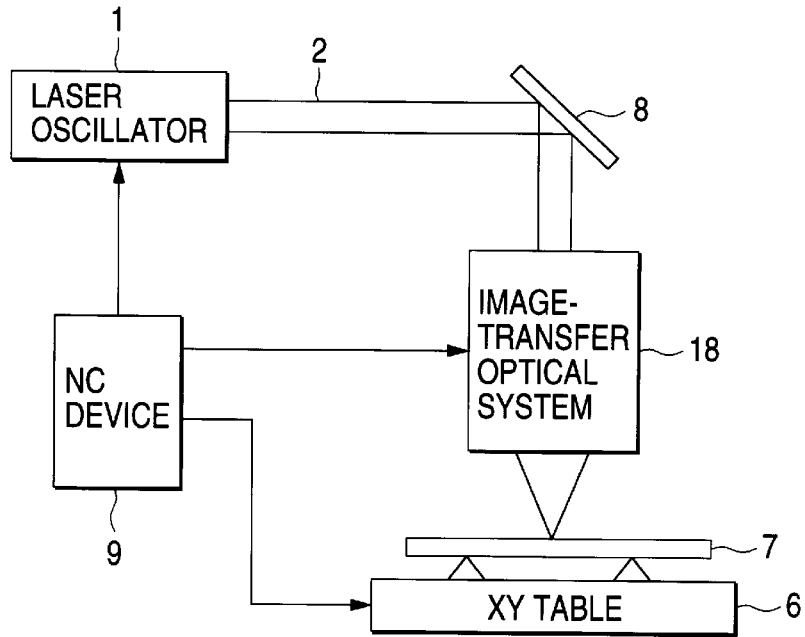
FIG. 17 is a schematic diagram of the laser beam machining apparatus in accordance with a ninth embodiment of the present invention.
Figure 18:
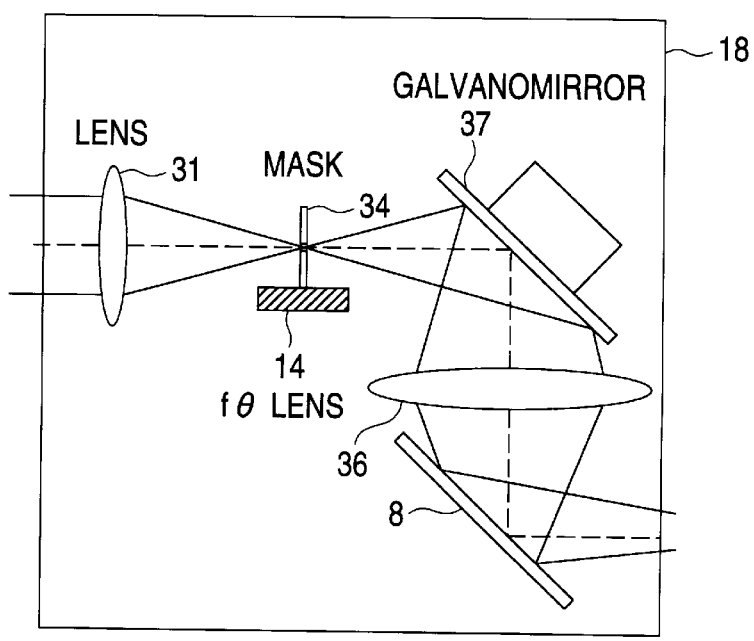
FIG. 18 is a schematic diagram of an image-transfer optical system in accordance with the ninth embodiment and a 10th embodiment of the present invention.

The configuration of the apparatus is shown in FIG. 17. Reference-numeral 1 denotes the laser oscillator; 2, the laser beam; 18, the image-transfer optical system; 6, the XY table; 7, the workpiece; 8, the reflecting mirror; and 9, the NC device. The image-transfer optical system 18 is shown in FIG. 18. Reference numeral 31 denotes the lens; 34; the mask whose position can be made changeable by the drive unit 14; and 36, the transferring fθ lens; 37, the galvanomirror. The positional relationship among the position-changeable mask 34, the lens 36, and the workpiece 7 is in such a positional relationship that the image of the mask is formed on the workpiece 7 at a certain magnification when the beam is directed vertically downward from the galvanomirror 37 to the fθ lens 36.

Figure 19:
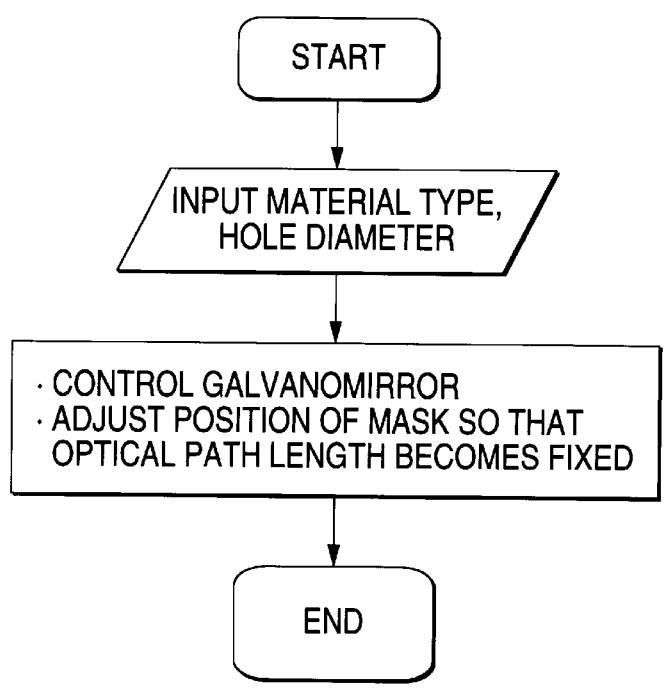
FIG. 19 is a flowchart illustrating a method of control in accordance with the ninth embodiment of the present invention.

Next, a description will be given of the operation. The position of the mask 34 is automatically controlled by the NC device 9 such that the optical path length between the mask 34 and the fθ lens 36 becomes fixed in a case where the beam is directed vertically downward from the galvanomirror 37 to the fθ lens 36 and in a case where the beam is directed diagonally downward. This is to ensure that even if the beam is scanned by the galvanomirror 37, the image of the mask 34 on the workpiece 7 does not become blurred, i.e., the hole diameter becomes fixed. A flowchart in this case is shown in FIG. 19.

(10th Embodiment)

Figure 20:
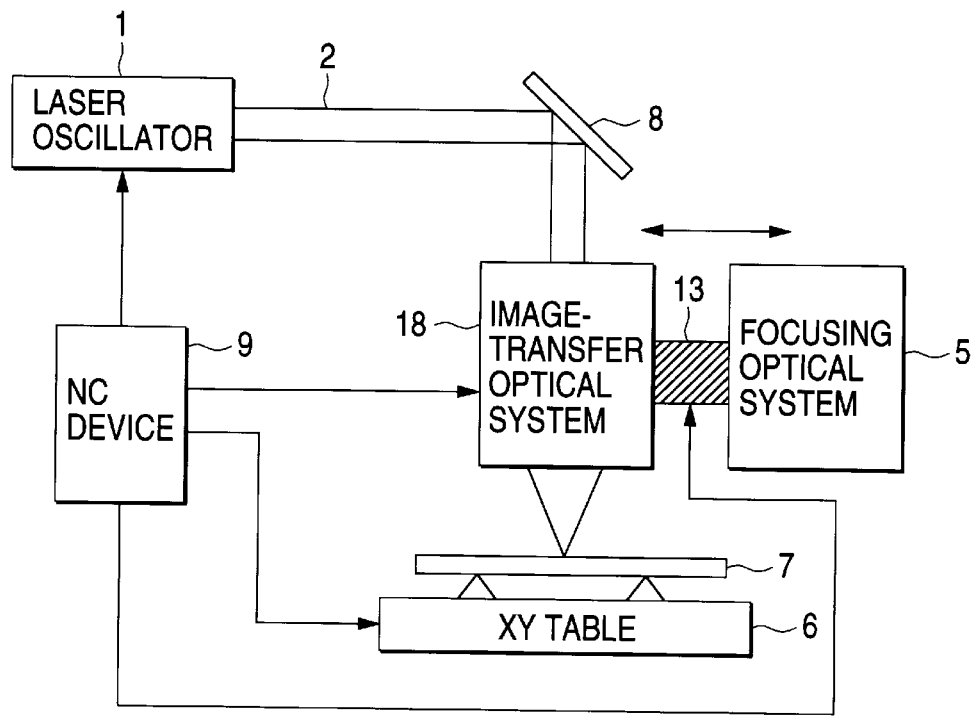
FIG. 20 is a schematic diagram of the laser beam machining apparatus in accordance with the 10th embodiment of the present invention.

The configuration of the apparatus is shown in FIG. 20. Reference numeral 1 denotes the laser oscillator; 2, the laser beam; 18, the image-transfer optical system; 5, the focusing optical system; 6, the XY table; 7, the workpiece; 8, the reflecting mirror; 9, the NC device; and 13, the drive unit for allowing either the image-transfer optical system 18 or the focusing optical system 5 to be inserted into or removed from the optical path between the laser oscillator and the workpiece.

The image-transfer optical system 18 has the same configuration as the one shown in FIG. 18, and the focusing optical system 5 has the same configuration as the one shown in FIG. 29.

Figure 21:
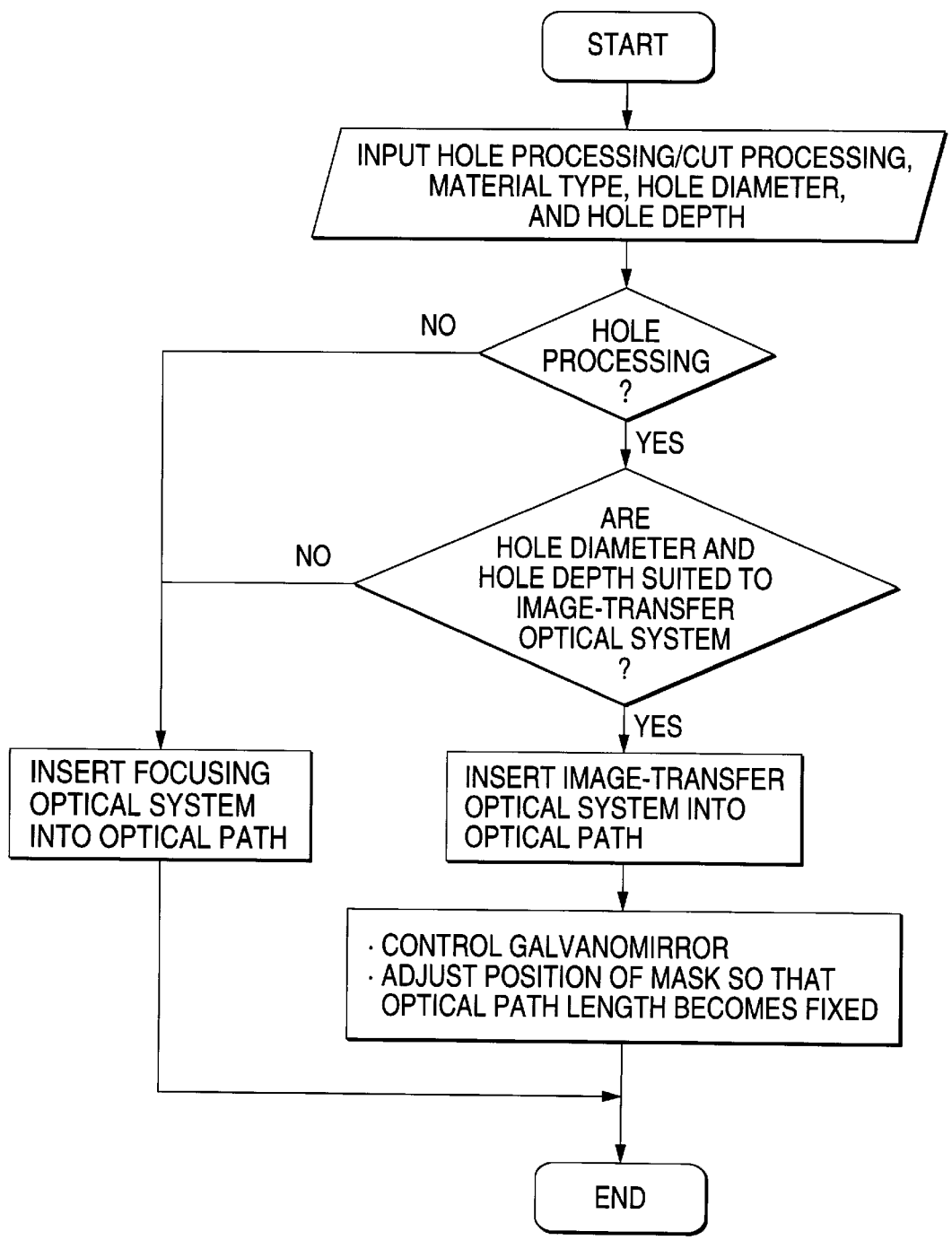
FIG. 21 is a flowchart illustrating a method of control in accordance with the 10th embodiment of the present invention.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, the hole depth, and the type of processing job, i.e., hole processing or cut processing, are selected. Which of the image-transfer optical system or the focusing optical system is suited to processing is stored in advance in the storage device of the NC device 9 depending on the details of processing, the hole diameter, and the hole depth. When the operator inputs a processing method, the hole diameter, and the hole depth to the NC device 9, the drive unit 13 is operated by the NC device 9 in such a manner as to allow either the image-transfer optical system 18 or the focusing optical system 5 to be automatically set between the laser oscillator and the workpiece. When the image-transfer optical system 18 is set in position, the position of the mask 34 is automatically controlled by the NC device 9 such that the optical path length between the mask 34 and the fθ lens 36 becomes fixed in a case where the beam is directed vertically downward from the galvanomirror 37 to the fθ lens 36 and in a case where the beam is directed diagonally downward. This is to ensure that even if the beam is scanned by the galvanomirror 37, the image of the mask 34 on the workpiece 7 does not become blurred, i.e., the hole diameter becomes fixed. A flowchart in this case is shown in FIG. 21.

(11th Embodiment)

Figure 22:
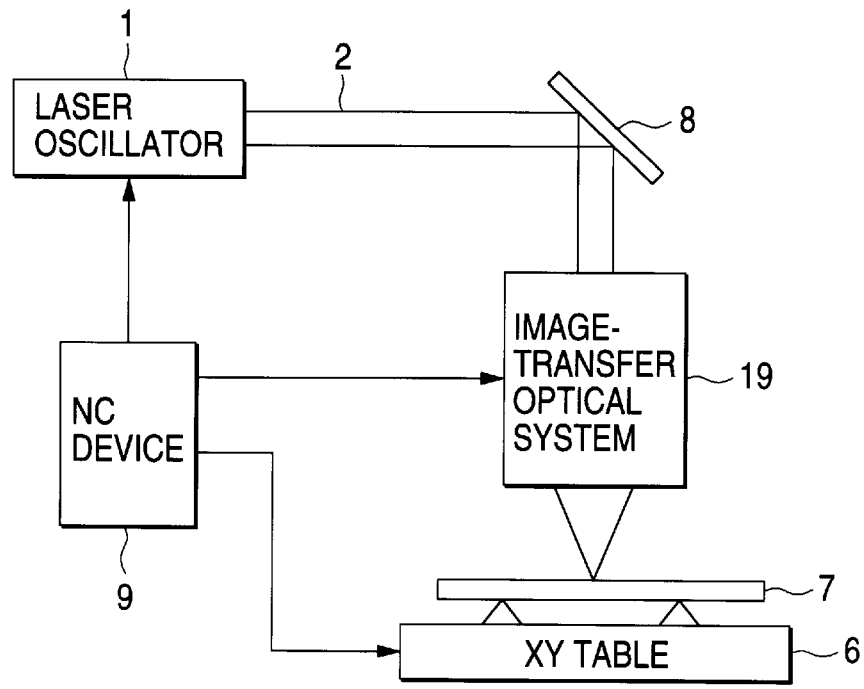
FIG. 22 is a schematic diagram of the laser beam machining apparatus in accordance with an 11th embodiment of the present invention.

The configuration of the apparatus is shown in FIG. 22. Reference numeral 1 denotes the laser oscillator; 2, the laser beam; 19, the image-transfer optical system; 6, the XY table; 7, the workpiece; 8, the reflecting mirror; and 9, the NC device.

Figure 23:
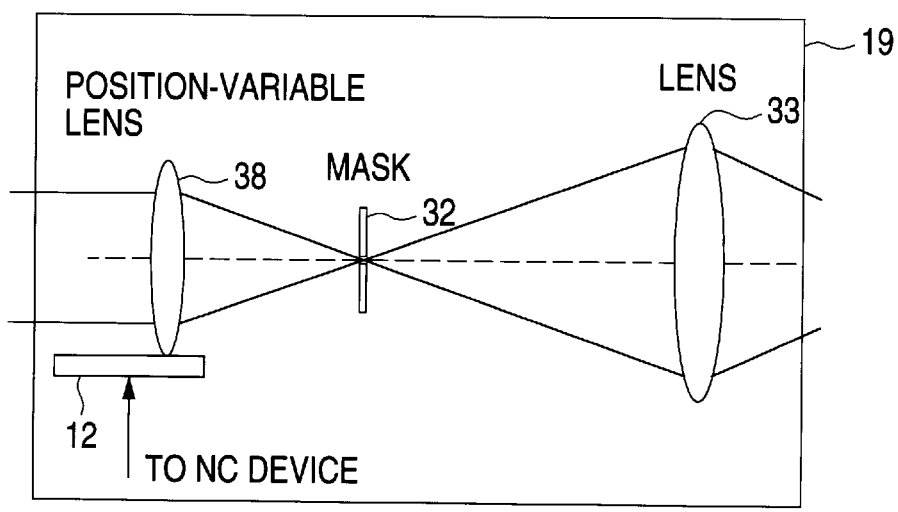
FIG. 23 is a schematic diagram of an image-transfer optical system in accordance with the 11th embodiment and a 12th embodiment of the present invention.

The image-transfer optical system 19 is shown in FIG. 23. Reference numeral 38 denotes a lens whose position is changeable by a drive unit 12; 32, the mask; and 33, the lens. The positional relationship among the mask 32, the lens 33, and the workpiece 7 is in such a positional relationship that the image of the mask is formed on the workpiece 7 at a certain magnification.

Next, a description will be given of the operation. If the position-changeable lens 38 is moved along the optical axis, the beam diameter can be changed on the beam-incident side of the mask, thereby making it possible to vary the amount of energy of the beam passing through the mask. For example, in a case where a pin hole with a 1 mm diameter is provided in the mask, and if the pin hole in the mask is radiated by a beam with a 2 mm diameter, the transmission rate of the energy is 11%. As the position-changeable lens 38 is thus moved along the optical path, it is possible to adjust the laser output on the processing surface.

Figure 24:
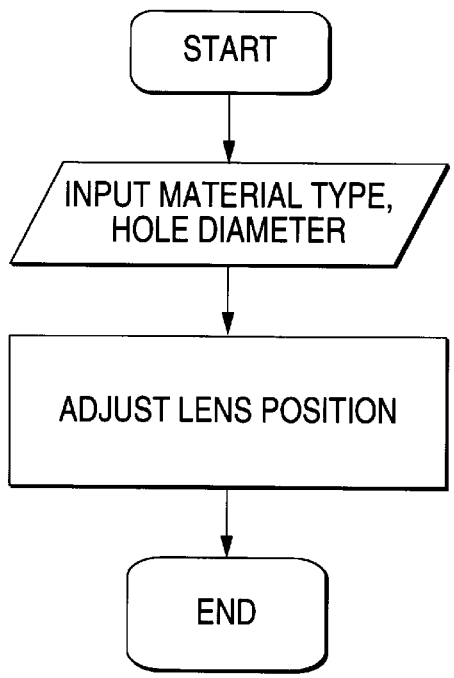
FIG. 24 is a flowchart illustrating a method of control in accordance with the 11th embodiment of the present invention.

A plurality of processing conditions, i.e., such conditions as a laser output and the like, are stored in advance in the storage device of the NC device 9. Optimum conditions suited to the material of the workpiece 7, the hole diameter, and the hole depth are selected. The position-changeable lens 38 is moved along the optical axis by the NC device 9 in correspondence with the laser output. Incidentally, the movement of the position-changeable lens 38 may be effected manually by the operator. A flowchart of the embodiment in this case is shown in FIG. 24.

(12th Embodiment)

Figure 25:
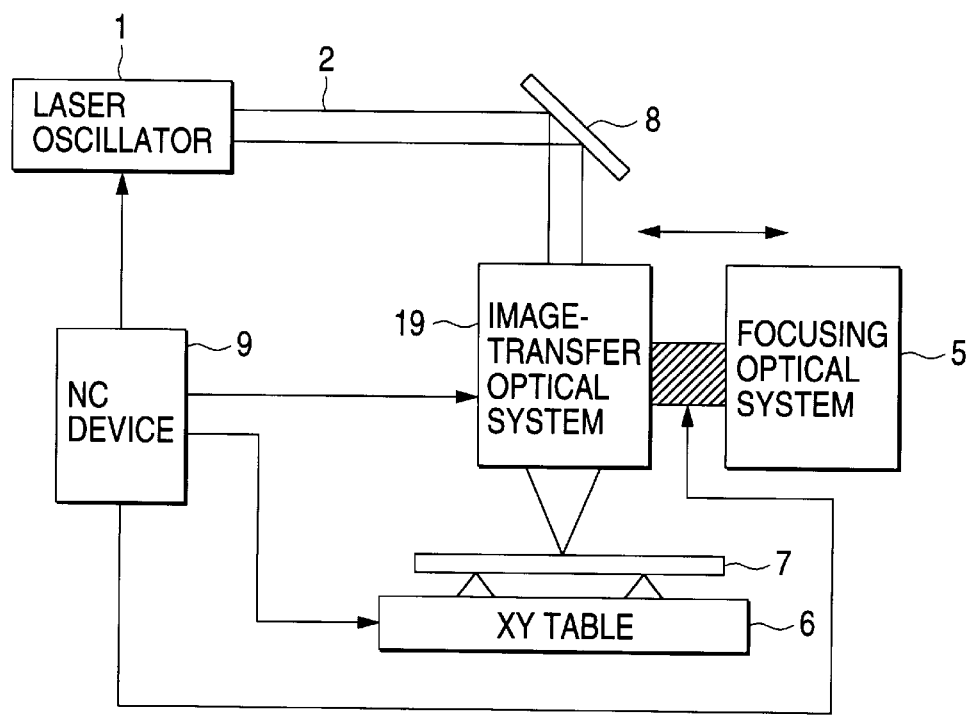
FIG. 25 is a schematic diagram of the laser beam machining apparatus in accordance with the 12th embodiment of the present invention.

The configuration of the apparatus is shown in FIG. 25. Reference numeral 1 denotes the laser oscillator; 2, the laser beam; 19, the image-transfer optical system; 5, the focusing optical system; 6, the XY table; 7, the workpiece; 8, the reflecting mirror; 9, the NC device; and 13, the drive unit for allowing either the image-transfer optical system 19 or the focusing optical system 5 to be inserted into or removed from the optical path between the laser oscillator and the workpiece. The image-transfer optical system 19 has the same configuration as the one shown in FIG. 23, and the focusing optical system 5 has the same configuration as the one shown in FIG. 29.

Figure 26:
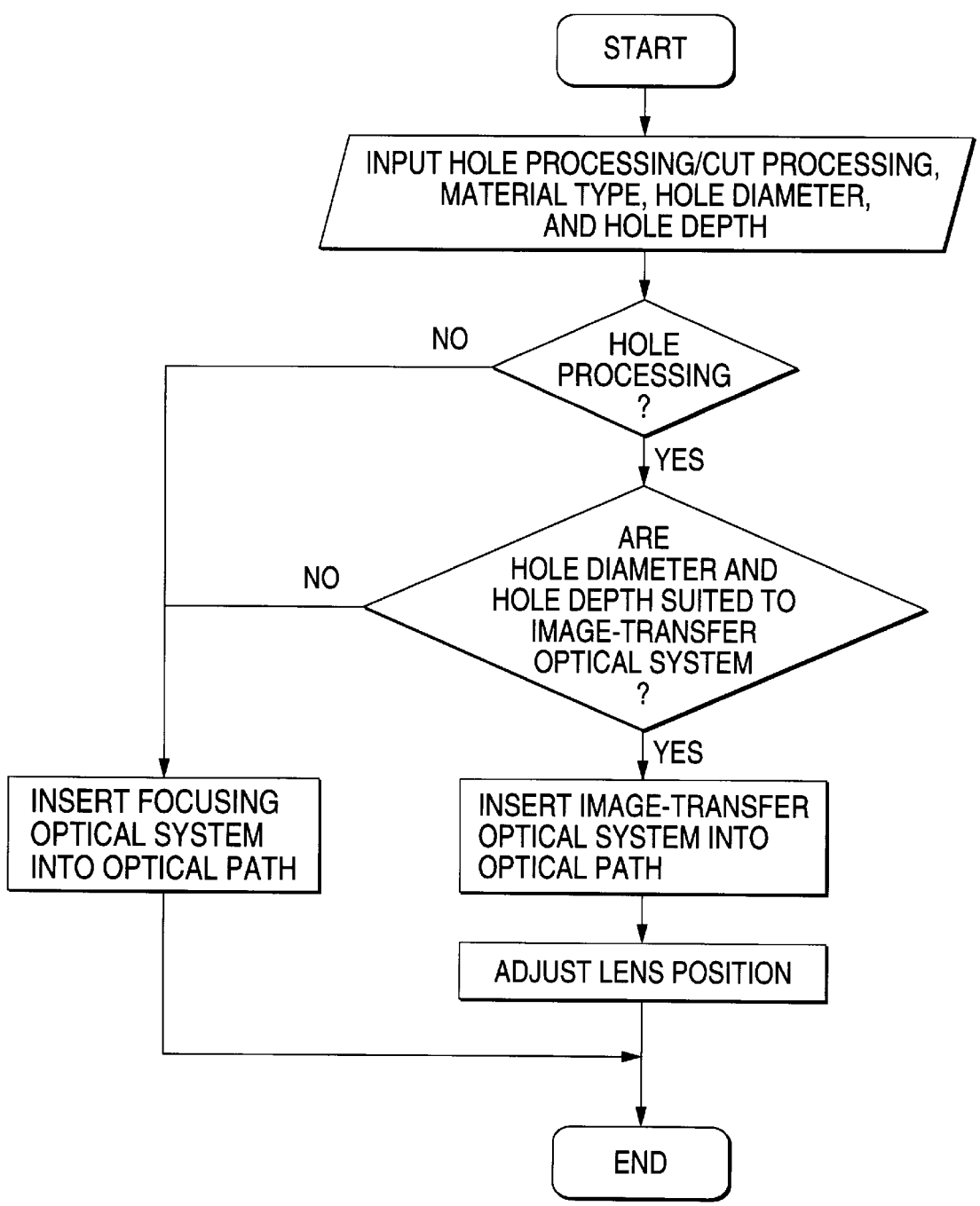
FIG. 26 is a flowchart illustrating a method of control in accordance with the 12th embodiment of the present invention.
Figure 27:
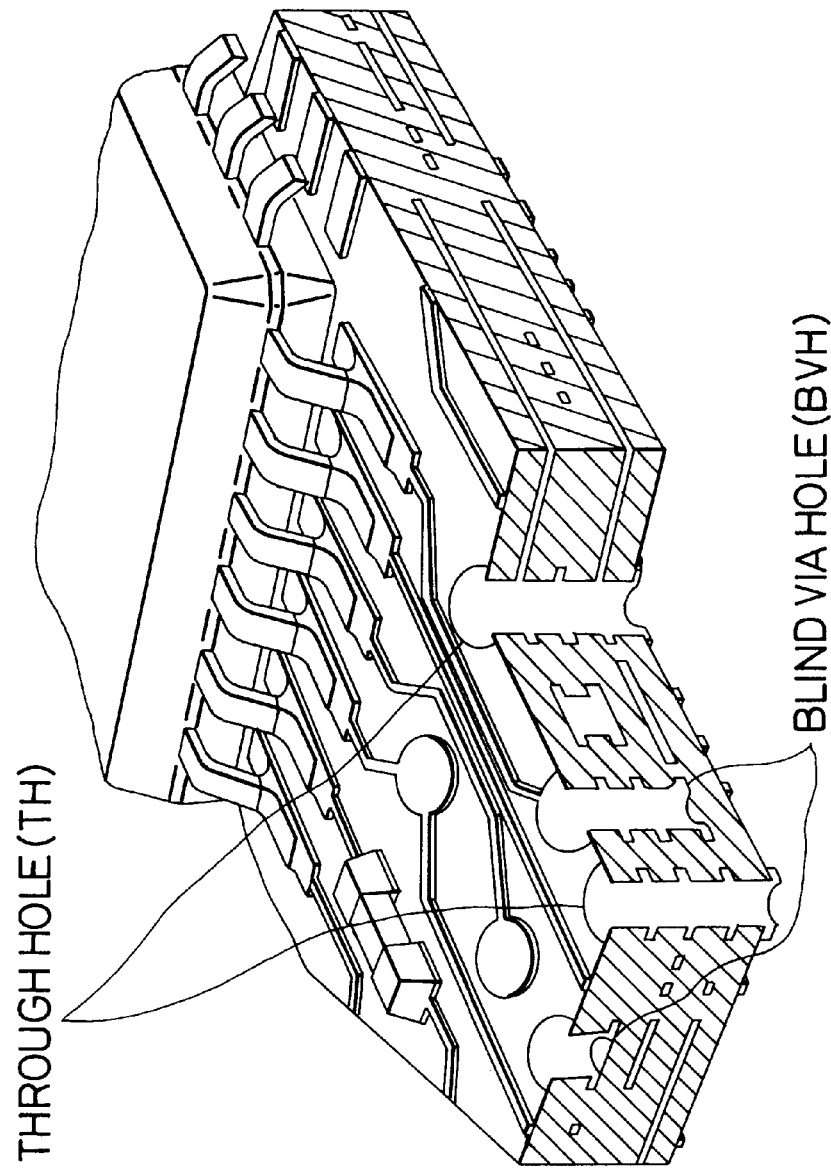
FIG. 27 is a cross-sectional view of a multilayered printed circuit board.
Figure 28:
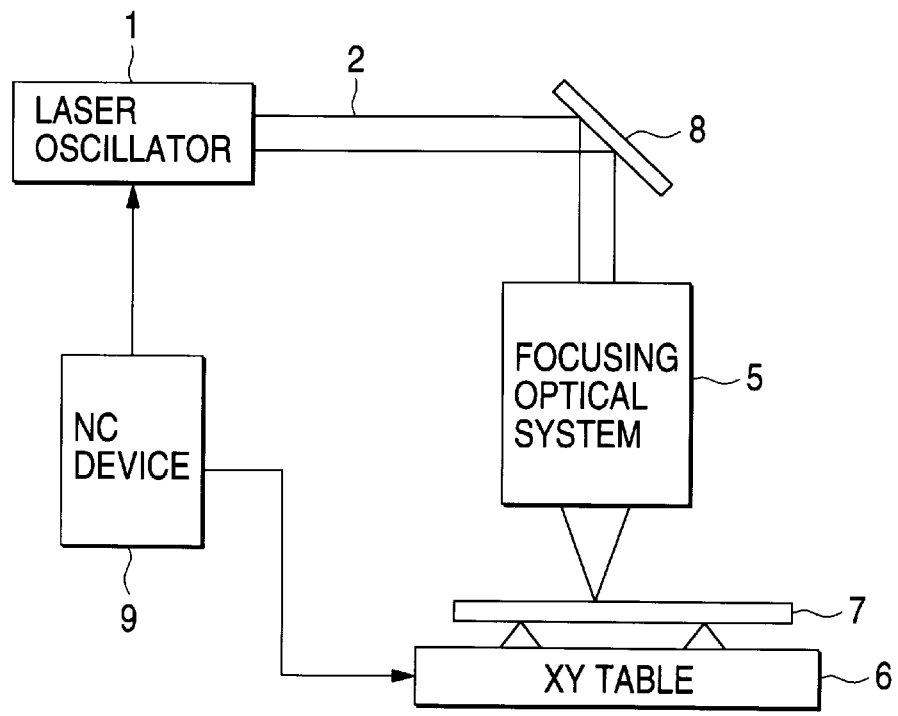
FIG. 28 is a schematic diagram of a conventional laser beam machining apparatus.

Next, a description will be given of the operation. A plurality of processing conditions, i.e., such conditions as a laser output and the like, are stored in advance in the storage device of the NC device 9. Optimum processing conditions suited to the material of the workpiece 7, the hole diameter, the hole depth, and the type of processing job, i.e., hole processing or cut processing, are selected. Which of the image-transfer optical system or the focusing optical system is suited to processing is stored in advance in the storage device of the NC device 9 depending on the details of processing, the hole diameter, and the hole depth. When the operator inputs a processing method, the hole diameter, and the hole depth to the NC device 9, the drive unit 13 is operated by the NC device 9 in such a manner as to allow either the image-transfer optical system 19 or the focusing optical system 5 to be automatically set between the laser oscillator and the workpiece. When the image-transfer optical system 19 is set in position, the position-changeable lens 38 is moved along the optical axis by the NC device 9 in correspondence with the laser output. Incidentally, the movement of the position-changeable lens 38 may be effected manually by the operator. A flowchart of the embodiment in this case is shown in FIG. 26.

Since the apparatus in accordance with the present invention is constructed as described above, the present invention offers the following advantages.

In accordance with the present invention, since the image-transfer optical system permits the processing of finer holes than the focusing optical system, and the focusing optical system permits the processing of deeper holes than the image-transfer optical system, by jointly using the image-transfer optical system and the focusing optical system, it is possible to enlarge regions of processable hole diameter and hole depth.

In addition, since a beam having a larger focal depth is required in the cut processing of circuit boards, and the focusing optical system makes it possible to obtain a beam having a larger focal depth than the image-transfer optical system, by jointly using the image-transfer optical system and the focusing optical system, cut processing and hole processing can be effected with high accuracy.

In addition, as the position of the mask and the focal length of the image-forming mirror are changed, it is possible to continuously change the beam diameter at the surface of the workpiece, and shorten the time required in changing the beam diameter at the surface of the workpiece.

In addition, since the image-transfer optical system makes it possible to obtain a smaller beam diameter at the surface of the workpiece than the focusing optical system, it is possible to enlarge the margin of the processing shape such as the diameter of a processable hole. Further, in the image-transfer optical system, as the position of the mask and the focal length of the image-forming mirror are changed, it is possible to continuously change the beam diameter at the surface of the workpiece, and shorten the time required in changing the beam diameter at the surface of the workpiece.

In addition, as the distance between the image-transfer optical system and the workpiece and the focal length of the image-forming mirror are changed, it is possible to continuously change the beam diameter at the surface of the workpiece. Further, since the image-transfer optical system is operated as a whole, the deviation of the optical axis of the mask can be prevented, thereby making it possible to prevent the deterioration of processing accuracy due to a change in the beam diameter at the surface of the workpiece. Moreover, it is possible to shorten the time required in changing the beam diameter at the surface of the workpiece.

In addition, since the image-transfer optical system makes it possible to obtain a smaller beam diameter at the surface of the workpiece than the focusing optical system, it is possible to enlarge the margin of the processing shape such as the diameter of a processable hole. Further, in the image-transfer optical system, as the distance between the image-transfer optical system and the workpiece and the focal length of the image-forming mirror are changed, it is possible to continuously change the beam diameter at the surface of the workpiece, and shorten the time required in changing the beam diameter at the surface of the workpiece. Further, since the image-transfer optical system is operated as a whole, the deviation of the optical axis of the mask can be prevented, thereby making it possible to prevent the deterioration of processing accuracy due to a change in the beam diameter at the surface of the workpiece. Moreover, it is possible to shorten the time required in changing the beam diameter at the surface of the workpiece.

In addition, in the image-transfer optical system, by changing the position of the mask, it is possible to prevent the deterioration of processing accuracy when the galvanomirror and the fθ lens are used.

In addition, since the image-transfer optical system makes it possible to obtain a smaller beam diameter at the surface of the workpiece than the focusing optical system, it is possible to enlarge the margin of the processing shape such as the diameter of a processable hole. Further, in the image-transfer optical system, by changing the position of the mask, it is possible to prevent the deterioration of processing accuracy when the galvanomirror and the fθ lens are used.

Further, in the image-transfer optical system, since it is possible to obtain a stable low output at the processing surface up to the vicinity of the rated output where the operation of the laser oscillator is stable, processing with high accuracy is possible.

In addition, by the joint use of the image-transfer optical system and the focusing optical system, it is possible to enlarge regions of processable hole diameter and hole depth, and it is possible to obtain a stable low output at the processing surface up to the vicinity of the rated output where the operation of the laser oscillator is stable, so that processing with high accuracy is possible.

What is claimed is:

1. A laser beam machining apparatus comprising:
    an image-transfer optical system;
    a focusing optical system;
    selecting means for selecting one of said image-transfer optical system and said focusing optical system;
    a numerical controller for controlling said image-transfer optical system, said focusing optical system, and said selecting means.

2. The laser beam machining apparatus of claim 1, wherein said image-transfer optical system further comprises:
    a mask inserted in an optical path between a laser oscillator and a workpiece, and
    a lens for reducing and forming an image received from said mask on a processing surface;
    wherein one of said image-transfer optical system and said focusing optical system is selected in correspondence with the diameter and depth of a hole to be processed.

3. The laser beam machining apparatus of claim 1, wherein said image-transfer optical system has further comprises:
    a mask inserted in an optical path between a laser oscillator and a workpiece, and
    a lens for reducing and forming an image received from said mask on a processing surface;
    wherein one of said image-transfer optical system and said focusing optical system is selected in correspondence with a type of processing.

4. The laser beam machining apparatus of claim 1, wherein said image-transfer optical system further comprises:

a position-changeable mask inserted in an optical path between a laser oscillator and a workpiece, and a curvature-changeable mirror for reducing and forming an image of said mask on a processing surface;

wherein when said image-transfer optical system is selected, a curvature of said curvature-changeable mirror and a position of said mask are controlled in correspondence with a hole diameter.

5. The laser beam machining apparatus of claim 1, wherein said image-transfer optical system further comprises:

a mask inserted in an optical path between a laser oscillator and a workpiece, and a curvature-changeable mirror for reducing and forming an image received from said mask on a processing surface;

wherein when said image-transfer optical system is selected, the curvature of said curvature-changeable mirror and a distance between the processing surface and said curvature-changeable mirror are controlled in correspondence with a hole diameter.

6. The laser beam machining apparatus of claim 1, wherein said image-transfer optical system further comprises:

a position-changeable mask inserted in an optical path between a laser oscillator and a workpiece, and a lens for reducing and forming an image received from said mask on a processing surface;

wherein when said image-transfer optical system is selected, a hole diameter is corrected by controlling a position of said mask in correspondence with an angle of incidence when a laser beam is made incident upon said lens diagonally at an angle.

7. The laser beam machining apparatus of claim 1, wherein said image-transfer optical system further comprises:

a mask inserted in an optical path between a laser oscillator and a workpiece, and a lens for reducing and forming an image received from said mask on a processing surface;

wherein when image-transfer optical system is selected, energy passing through said mask is adjusted by changing a laser beam diameter on a laser-beam incident side of said mask, so as to adjust energy at the processing surface.

8. The laser beam machining apparatus of claim 2, wherein a type of processing is selected from a group of hole processing, groove processing, and profile cut processing.

9. A laser beam machining apparatus comprising:

an image-transfer optical system which includes
a curvature-changeable mirror for reducing and forming an image received from a mask on a processing surface, a numerical controller for controlling said image-transfer optical system, said mask consisting of a position-changeable mask inserted in an optical path between a laser oscillator and a workpiece, wherein a curvature of said curvature-changeable mirror and a desired position of said mask are controlled in correspondence with a hole diameter to be machined in said workpiece.

10. A laser beam machining apparatus comprising:

an image-transfer optical system which includes
a curvature-changeable mirror for reducing and forming an image of a mask on a processing surface, a numerical controller for controlling said image-transfer optical system, said mask inserted in an optical path between a laser oscillator and a workpiece;

a means for changing a distance between the processing surface and said curvature-changeable mirror; wherein the curvature of said curvature-changeable mirror and the distance between the processing surface and said curvature-changeable mirror are controlled in correspondence with a desired hole diameter to be maintained in said workpiece.

11. A laser beam machining apparatus comprising:

an image-transfer optical system which includes
a curvature-changeable mirror for reducing and forming an image of a mask on a processing surface, a numerical controller for controlling said image-transfer optical system, a position changeable mask inserted in an optical path between a laser oscillator and a workpiece, wherein a hole diameter is corrected by controlling a position of said mask in correspondence with an angle of incidence when a laser beam is made incident upon a lens diagonally at an angle.

12. A laser beam machining apparatus comprising:

an image-transfer optical system having
a mask inserted in an optical path between a laser oscillator and a workpiece, a lens for reducing and forming an image of said mask on a processing surface, and changeable means for changing a distance between the processing surface and said curvature-changeable mirror; and a numerical controller for controlling said image-transfer optical system, wherein energy passing through said mask is adjusted by changing a laser beam diameter on a laser-beam incident side of said mask, so as to adjust energy at the processing surface.

* * * * *